(12) United States Patent
Tsuda

(10) Patent No.: US 11,101,281 B2
(45) Date of Patent: Aug. 24, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventor: Shibun Tsuda, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 29 days.

(21) Appl. No.: 16/384,444

(22) Filed: Apr. 15, 2019

(65) Prior Publication Data

US 2019/0348428 A1    Nov. 14, 2019

(30) Foreign Application Priority Data

May 8, 2018   (JP) .............................. JP2018-089979

(51) Int. Cl.
| | |
|---|---|
| *H01L 21/28* | (2006.01) |
| *H01L 27/11565* | (2017.01) |
| *H01L 29/78* | (2006.01) |
| *H01L 29/06* | (2006.01) |
| *H01L 29/423* | (2006.01) |

(52) U.S. Cl.
CPC .. *H01L 27/11565* (2013.01); *H01L 21/28194* (2013.01); *H01L 29/0642* (2013.01); *H01L 29/40117* (2019.08); *H01L 29/4234* (2013.01); *H01L 29/785* (2013.01)

(58) Field of Classification Search
CPC ........... H01L 29/40117; H01L 29/4234; H01L 27/0886; H01L 29/785

See application file for complete search history.

(56) References Cited

U.S. PATENT DOCUMENTS

| 7,504,689 B2 | 3/2009 | Hisamoto et al. |
| 2005/0242388 A1 | 11/2005 | Wilier et al. |
| 2006/0044915 A1* | 3/2006 | Park .................. H01L 27/11526 365/222 |
| 2007/0176223 A1* | 8/2007 | Chindalore ............ B82Y 10/00 257/314 |

(Continued)

FOREIGN PATENT DOCUMENTS

| JP | 2006-041354 A | 2/2006 |
| JP | 2015-065426 A | 4/2015 |
| JP | 2017-224666 A | 12/2017 |

OTHER PUBLICATIONS

Japanese Notice of Reasons for Refusal issued in corresponding Japanese Patent Application No. 2018-089979, dated Jun. 22, 2021, with English translation.

*Primary Examiner* — Khaja Ahmad
*Assistant Examiner* — Khatib A Rahman
(74) *Attorney, Agent, or Firm* — McDermott Will & Emery LLP

(57) ABSTRACT

The semiconductor device includes a fin FA selectively protruded from an upper surface of a semiconductor substrate SB, a gate insulating film GF1 formed on an upper surface and a side surface of the fin FA and having an insulating film X1 and a charge storage layer CSL, and a memory gate electrode MG formed on the gate insulating film GF1. Here, the thickness of the charge storage layer CSL on the upper surface of the fin FA is larger than the thickness of the charge storage layer CSL on the side surface of the fin FA.

12 Claims, 25 Drawing Sheets

(56) References Cited

U.S. PATENT DOCUMENTS

| | | | |
|---|---|---|---|
| 2010/0200909 A1* | 8/2010 | Kawashima | H01L 29/792 257/326 |
| 2011/0095348 A1* | 4/2011 | Chakihara | H01L 29/4975 257/298 |
| 2011/0110156 A1* | 5/2011 | Kawashima | H01L 28/60 365/185.08 |
| 2011/0260228 A1* | 10/2011 | Kawashima | H01L 29/4234 257/298 |
| 2013/0175604 A1* | 7/2013 | Polishchuk | H01L 29/7926 257/325 |
| 2014/0008716 A1* | 1/2014 | Arigane | H01L 29/66833 257/326 |
| 2015/0060844 A1 | 3/2015 | Miyairi et al. | |
| 2015/0060991 A1* | 3/2015 | Mizutani | H01L 21/02148 257/324 |
| 2017/0062440 A1* | 3/2017 | Arigane | H01L 29/792 |
| 2017/0062445 A1* | 3/2017 | Yamashita | H01L 29/41791 |
| 2017/0084625 A1* | 3/2017 | Takeuchi | H01L 29/792 |
| 2017/0200726 A1* | 7/2017 | Tsuda | H01L 29/42344 |
| 2017/0358592 A1 | 12/2017 | Yamaguchi | |

* cited by examiner

| OPERATION \ APPLIED VOLTAGE | Vd | Vcg | Vmg | Vs | Vb |
|---|---|---|---|---|---|
| WRITE | Vcc | 0.5V | 10V | 5V | 0V |
| ERASE | 0V | 0V | -5V | 5V | 0V |
| READ | Vcc | Vcc | 0V | 0V | 0V |

Vcc = 1.5V

SEMICONDUCTOR DEVICE AND METHOD OF MANUFACTURING THE SAME

CROSS-REFERENCE TO RELATED APPLICATIONS

The disclosure of Japanese Patent Application No. 2018-89979 filed on May 8, 2018 including the specification, drawings and abstract is incorporated herein by reference in its entirety.

BACKGROUND

The present invention relates to a semiconductor device and a method of manufacturing the same, and more particularly, to a technique effective for application to a semiconductor device including a fin-type transistor.

Flash memory or EEPROM (Electrically Erasable and Programmable Read Only Memory) is widely used as a nonvolatile memory capable of electrically writing and erasing. These storage devices have a conductive floating gate electrode or a trapping insulating film surrounded by an oxide film below the gate electrode of MISFET (Metal Insulator Semiconductor Field Effect Transistor), and the charge accumulation state in the floating gate or the trapping insulating film is used as storage information, which is read out as a threshold value of the transistor. The trapping insulating film refers to an insulating film capable of storing charges, and as an example, a silicon nitride film or the like can be given. By shifting the threshold of the MISFET by injecting and discharging charges into and from the charge storage layers, the MISFET can be used as a nonvolatile memory. This flash memory is also referred to as a MONOS (Metal-Oxide-Nitride-Oxide-Semiconductor type transistor. In addition, split-gate memory cell in which a MONOS transistor is used as a memory transistor and a control transistor is further added is widely used.

In addition, a fin transistor is known as a field effect transistor capable of increasing an operation speed, reducing a leakage current and power consumption, and miniaturizing a semiconductor device. The fin-type transistor (FINFET: FIN Field Effect Transistor) is, for example, a semiconductor device having a semiconductor layer protruded from a semiconductor substrate as a channel region, and having a gate electrode formed so as to straddle the protruded semiconductor layer.

Japanese unexamined Patent Application publication No. 2006/41354 discloses a technique of forming a split-gate memory cell including a MONOS transistor in a FINFET structure.

SUMMARY

In the fin-type transistor, a gate insulating film is formed on an upper surface and a side surface of the fin, and the strength of an electric field applied to the gate insulating film is different in each portion of the fin. Therefore, a portion where dielectric breakdown of the gate insulating film tends to occur and a portion where dielectric breakdown of the gate insulating film hardly occurs coexist. Accordingly, it is required to improve a portion where dielectric breakdown easily occurs in the gate insulating film covering the fin.

Other objects and novel features will be clarified from the description of this specification and the accompanying drawings.

The typical ones of the embodiments disclosed in the present application will be briefly described as follows.

A semiconductor device according to one embodiment includes an element isolation portion formed on a main surface of a semiconductor substrate, and a protruding portion formed on the main surface of the semiconductor substrate defined by the element isolation portion and formed of a semiconductor layer protruded from than the element isolation portion. The semiconductor device further includes a first insulating film formed so as to cover the protruding portion, a first gate insulating film formed so as to cover the first insulating film and including a first trapping insulating film, and a first gate electrode formed so as to cover the first gate insulating film. Here, the protruding portion has a first side surface, a second side surface opposed to the first side surface, and an upper surface positioned between the first side surface and the second side surface in plan view, and a thickness of the first trapping insulating film in the upper surface of the protruding portion is larger than a thickness of the first trapping insulating film in the first side surface and the second side surface.

In addition, a semiconductor device of one embodiment includes an element isolation portion formed on an upper surface of a semiconductor substrate, and a nonvolatile memory cell formed on the semiconductor substrate and formed on a protruding portion protruded from the element isolation portion. Here, the nonvolatile memory cell has a charge storage layer, and a thickness of the charge storage layer in the upper surface of the protruding portion is larger than a thickness of the charge storage layer in the side surface of the protruding portion.

According to one embodiment, reliability of the semiconductor device can be improved.

DETAILED DESCRIPTION

Figure 1:
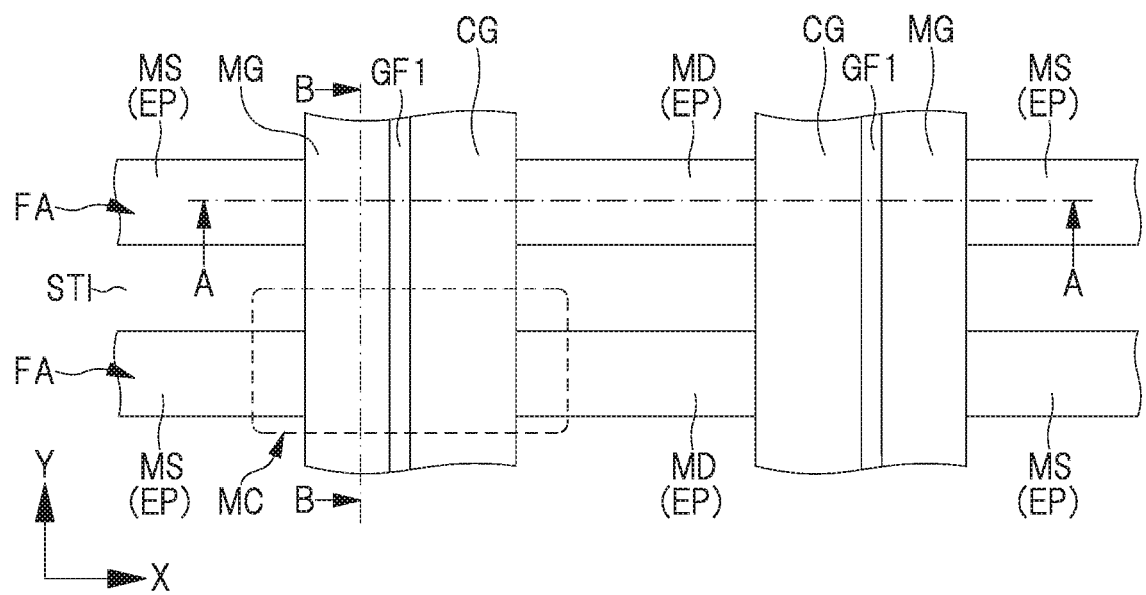
FIG. 1 is a plan view illustrating a semiconductor device of a first embodiment.

In the following embodiments, when it is necessary for convenience, the description will be made by dividing into a plurality of sections or embodiments, but except for the case specifically specified, these sections and embodiments are not independent of each other, and one of them is related to some or all of modified examples, details and supplementary description. In the following embodiments, the number of elements (including numbers numerical values, quantities, ranges, etc.) is not limited to the specific number, and may be less or greater than or equal to the specific number, except for cases where the number is specifically indicated and is clearly limited to the specific number in principle. Furthermore, in the following embodiments, constituent elements (including element steps and the like) are not necessarily essential except in the case where they are specifically specified and the case where they are considered to be obviously essential in principle. Similarly, in the following embodiments, when referring to the shapes and the like and the positional relationships and the like, it is assumed that the shapes and the like are substantially approximate to or similar to the shapes and the like, except for the case in which they are specifically specified and the case in which they are considered to be obvious in principle. The same applies to the above numerical values and ranges.

Below, the embodiments will be described in detail by reference to the accompanying drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted in order to make the drawings easier to see.

First Embodiment

Figure 2:
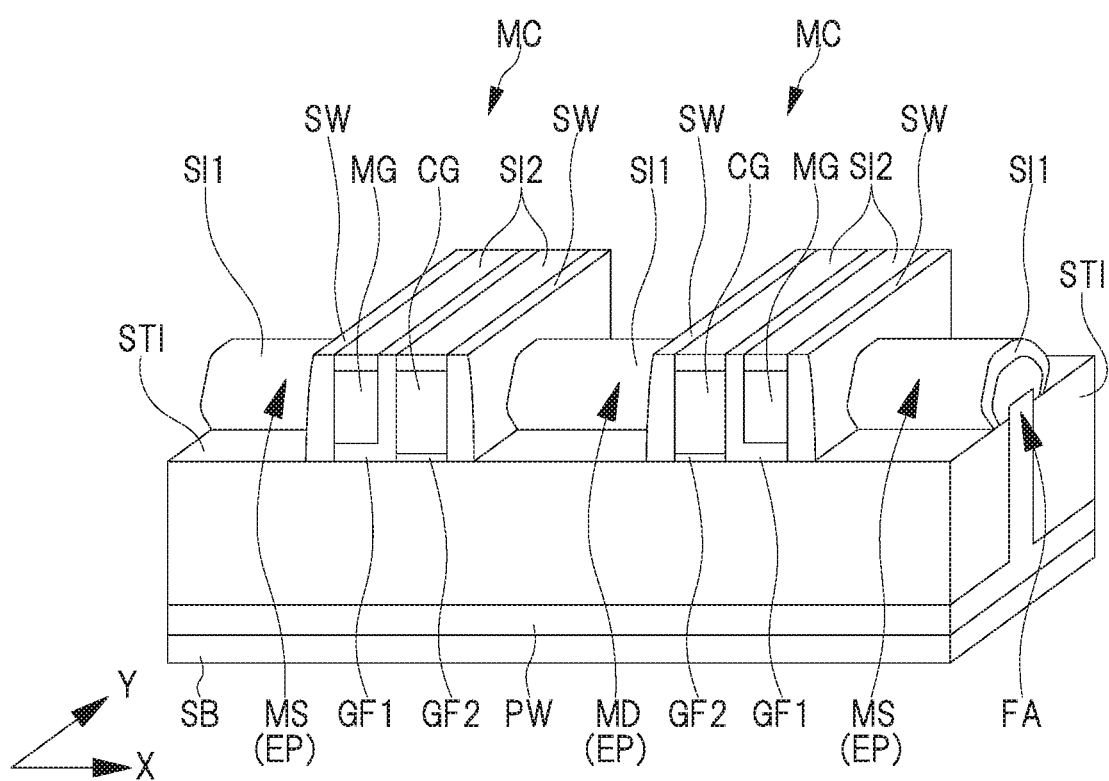
FIG. 2 is a perspective view illustrating a semiconductor device of the first embodiment.
Figure 3:
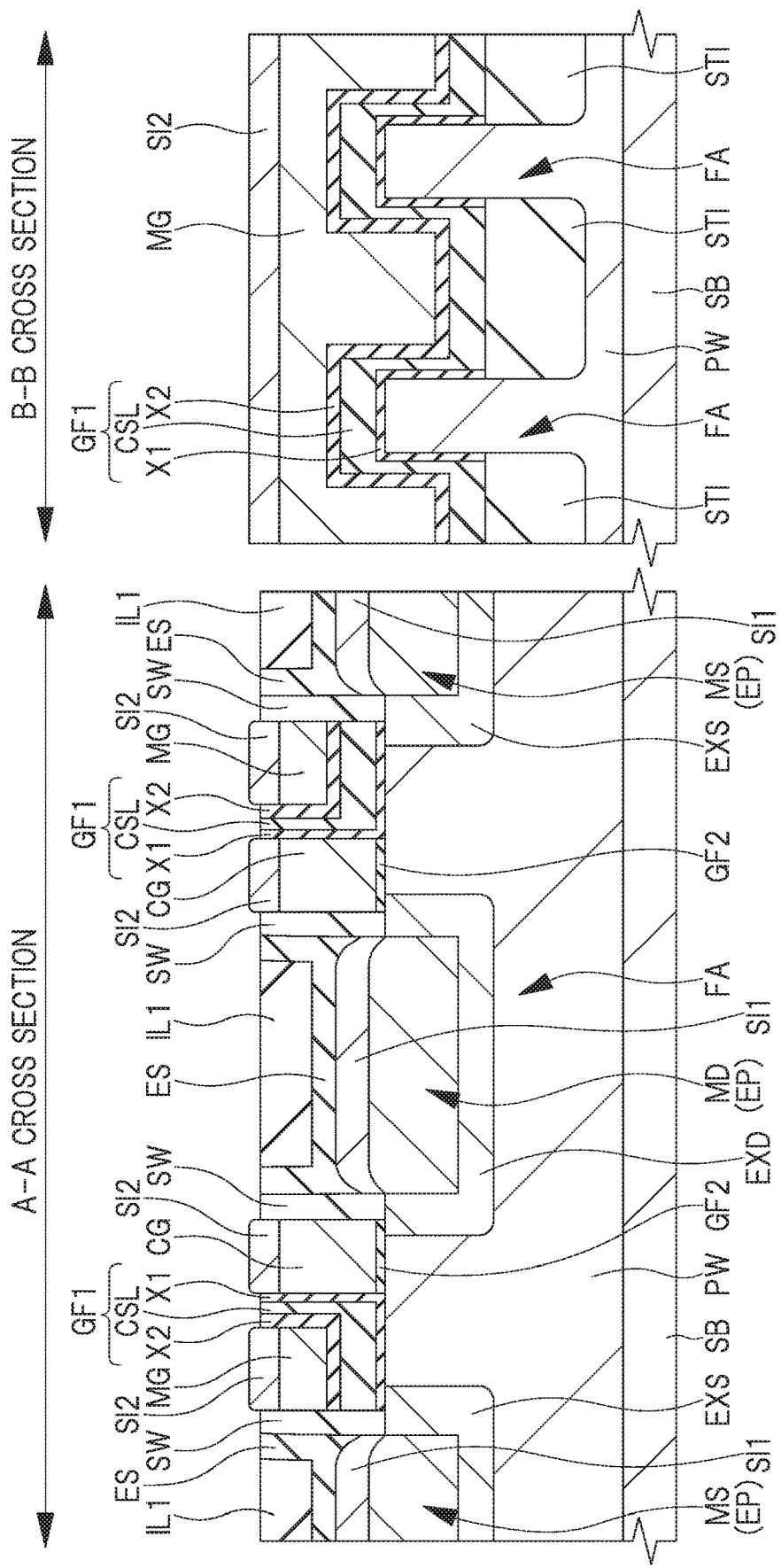
FIG. 3 is a cross-sectional view illustrating a semiconductor device of the first embodiment.

A semiconductor device including a memory cell (nonvolatile memory cell) MC of a fin-type transistor in present embodiment will be described with reference to the drawings. FIG. 1 is a plan view of a memory cell MC. FIG. 2 is a perspective view of the memory cell MC. FIG. 3 shows a cross-sectional view corresponding to line A-A and line B-B of FIG. 1.

Note that although the semiconductor device of present embodiment includes logic circuits, analogue circuits, SRAM circuits, input/output circuits, and the like in addition to the memory cell MC described above, the semiconductor device of present embodiment is characterized mainly by the memory cell MC, and therefore, detailed descriptions of other circuits are omitted.

Structure of Semiconductor Device

The structure of the memory cell MC of the present embodiment will be described below with reference to FIGS. 1 to 3.

In plan view, a plurality of fins FA extending in the X direction are arranged on the semiconductor substrate SB at equal intervals in the Y direction. The X direction and the Y direction are directions along the main surface of the semiconductor substrate SB, and the X direction is orthogonal to the Y direction. The length of the fin FA in the X direction is longer than the length of the fin FA in the Y direction. That is, the X direction is the long side direction of the fin FA, and the Y direction is the short side direction of the fin FA. The fin FA is a part of the semiconductor substrate SB, and is a protruding portion of a rectangular parallelepiped that selectively protrudes from the upper surface of the semiconductor substrate SB.

An element isolation portion STI is formed on the main surface of the semiconductor substrate SB between the plurality of fins FA. The position of the upper surface of the element isolation portion STI is lower than the position of the upper surface of the fin FA. In other words, a part of the fin FA is a semiconductor layer protruded from the element isolation portion STI, and the other part of the fin FA is positioned so as to be sandwiched by the element isolation portion STI in the Y direction. As described above, the upper portion of each fin FA is insulated and isolated by the element isolation portion STI. In the present embodiment, the fin FA located higher than the upper surface of the element isolation portion STI may be referred to as the upper portion of the fin FA, and the fin FA located lower than the upper surface of the element isolation portion STI may be referred to as the lower portion of the fin FA.

The upper portion of the fin FA is mainly an active region for forming the memory cell MC. That is, in the semiconductor substrate SB, a region defined by the element isolation portion STI is an active region.

The fin FA does not necessarily have to be a rectangular parallelepiped, and the corners of the rectangle may be rounded when viewed in cross section in the Y direction. The side surface of the fin FA may be perpendicular to the main surface of the semiconductor substrate SB, or may have an inclination angle close to perpendicular to the main surface of the semiconductor substrate SB. The upper surface of the fin FA is a region located between the two side surfaces of the fin FA in plan view.

In addition, the upper surface of the fin FA has a top portion which is the highest position of the fin FA, and the side surface of the fin FA has a side portion which is positioned intermediate between the top portion of the fin FA and the upper surface of the element isolation portion STI. In the present embodiment, the description is made on the assumption that the top portion of the fin FA is a part of the upper surface of the fin FA, and the side portion of the fin FA is a part of the side surface of the fin FA.

A plurality of memory gate electrodes MG and a plurality of control gate electrodes CG that are extending in the Y direction are arranged over the plurality of fins FA. The plurality of memory gate electrodes MG and the plurality of control gate electrodes CG are formed so as to cover the upper surface and the side surface of the fin FA via the gate insulating film GF1 and the gate insulating film GF2, respectively.

An n-type diffusion region MD which is a part of a drain region is formed in the fin FA on the control gate electrode CG side, and an n-type diffusion region MS which is a part of a source region is formed in the fin FA on the memory gate electrode MG side. The diffusion region MD and the diffusion region MS are formed so as to sandwich a channel region which is a portion of the fin FA covered with the control gate electrode CG and the memory gate electrode MG, in the X direction. That is, in the X direction, one control gate electrode CG and one memory gate electrode MG are located between the diffusion region MS and the diffusion region MD.

The diffusion region MD is formed between two control gate electrodes CG adjacent to each other in the X direction, and the diffusion region MS is formed between two memory gate electrodes MG adjacent to each other in the X direction. As described above, two memory cells MC adjacent in the X direction share the diffusion region MD or the diffusion region MS. Two memory cells MC sharing the diffusion region MD have line symmetry in the X direction with the diffusion region MD as an axis, and two memory cells MC sharing the diffusion region MS have line symmetry in the X direction with the diffusion region MS as an axis.

In the fin FA on the control gate electrode CG side, an n-type extension region EXD having impurity concentration lower than that of the diffusion region MD is formed as a part of the drain region. In the fin FA on the memory gate electrode MG side, an n-type extension region EXS having impurity concentration lower than that of the diffusion region MS is formed as a part of the source region. The extension region EXD is connected to the diffusion region MD and extends to below the sidewall spacer SW on the control gate electrode CG side. The extension region EXS is connected to the diffusion region MS and extends to below the sidewall spacer SW on the memory gate electrode MG side.

The memory cell MC of the present embodiment is a MISFET having the memory gate electrode MG, the gate insulating film GF1, the control gate electrode CG, the gate insulating film GF2, the diffusion region MD, the extension region EXD, the diffusion region MS, and the extension region EXS, and is a nonvolatile memory cell.

An interlayer insulating film IL1 and an etching stopper film ES are formed on each memory cell MC, but are not shown in FIGS. 1 and 2. The interlayer insulating film IL1 and the etching stopper film ES are provided with plugs for electrically connecting the diffusion region MD and the diffusion region MS of each memory cell MC to a wiring serving as a bit line and a wiring serving as a source line, respectively.

Hereinafter, the cross-sectional structure of the semiconductor device of present embodiment will be described in detail with reference to FIG. 3. As described above, FIG. 3 is a cross-sectional view corresponding to the line A-A and the line B-B of FIG. 1, in which the section A-A shows two memory cells MC in the X direction, and the section B-B shows two fins FA under the memory gate electrode MG in the Y direction.

A well region PW, which is a semiconductor region having p-type conductivity, is formed in the semiconductor substrate SB including the fin FA.

As shown in the A-A cross section, on the upper surface of the fin FA which is in the upper portion of the fin FA protruded from the element isolation portion STI, the memory gate electrode MG is formed via a gate insulating film GF1, and the control gate electrode CG is formed via a gate insulating film GF2. In the X direction, a gate insulating film GF1 is interposed between the memory gate electrode MG and the control gate electrode CG, and the control gate electrode CG and the memory gate electrode MG are electrically separated by the gate insulating film GF1.

As shown in the B-B cross section, the gate insulating film GF1 is formed on the upper surface of the fin FA so as to cover the upper surface and the side surface of the fin FA, and is also formed on the upper surface of the element isolation portion STI between two adjacent fins FA. Although not illustrated, the gate insulating film GF2 is formed on the fin FA so as to cover the upper surface and the side surface of the fin FA.

In the present embodiment, the gate insulating film GF1 is formed of a multilayer film including an insulating film X1, a charge storage layer CSL formed on the insulating film X1, and an insulating film X2 formed on the charge storage layer CSL.

The insulating film X1 is a silicon oxide film formed on the upper surface and the side surface of the fin FA, and has a thickness of about 3 to 5 nm.

The charge storage layer CSL is formed over the upper surface and the side surface of the fin FA with the insulating film X1 interposed therebetween, and is also formed over the upper surface of the element isolation portion STI between two adjacent fins FA. The charge storage layer CSL is, for example, a metal oxide film containing hafnium (Hf) and silicon (Si). In present embodiment, a hafnium silicate film (HfSiO film) is representatively exemplified as such a metal oxide film. The charge storage layer CSL is a film provided for storing data of the memory cell MC, and is a trapping insulating film having a trap level capable of storing charge.

The main feature of the present embodiment is that the thickness of the charge storage layer CSL formed over the upper surface of the fin FA is thicker than the thickness of the charge storage layer CSL formed over the side surface of the fin FA. For example, the thickness of the charge storage layer CSL formed over the upper surface of the fin FA is about 10 to 28 nm, and the thickness of the charge storage layer CSL formed over the side surface of the fin FA is about 5 to 7 nm. As a result, the electric field applied to the insulating film X1 can be relaxed over the upper surface of the fin FA, and the reliability of the memory cell MC can be improved. The details of the effects of the feature will be described later.

The insulating film X2 is formed over the upper surface and the side surface of the fin FA with the insulating film X1 and the charge storage layer CSL interposed therebetween, and is, for example, a silicon oxide film or a metal oxide film containing aluminum (Al), and has a thickness of about 8 to 10 nm. In present embodiment, an alumina film (AlO film) is representatively exemplified as the metal oxide film of the insulating film X2. The insulating film X2 is a film provided to improve the dielectric breakdown voltage between the charge storage layer CSL and the memory gate electrode MG. The insulating film X2 may be a silicon oxide film, but when it is desired to increase the equivalent silicon oxide thickness and reduce the physical thickness, a metal oxide film having a dielectric constant higher than that of the silicon oxide film can be used.

The memory gate electrode MG is formed on the insulating film X2 and is a conductive film made of, for example, a polycrystalline silicon film having n-type conductivity. A silicide layer SI2 is formed on the memory gate electrode MG. The silicide layer SI2 is made of, for example, nickel silicide (NiSi), nickel platinum silicide (NiPtSi), or cobalt silicide ($CoSi_2$).

As described above, the insulating film X1, the charge storage layer CSL, and the insulating film X2 are formed in this order between the upper surface of the fin FA and the memory gate electrode MG.

The gate insulating film GF2 is, for example, a silicon oxide film formed on the upper surface and the side surface of the fin FA, and has a thickness of about 2 to 4 nm. The gate insulating film GF2 may be formed of a metal oxide film such as a hafnium oxide film instead of the silicon oxide film.

The control gate electrode CG is formed on the gate insulating film GF2, and is a conductive film made of, for example, a polycrystalline silicon film having n-type conductivity. A silicide layer SI2 similar to that on the memory gate electrode MG is formed on the control gate electrode CG.

The side surface of the memory gate electrode MG on the source region side of the memory cell MC is covered with the sidewall spacer SW. The side surface of the control gate electrode CG on the drain region side of the memory cell MC is covered with the sidewall spacer SW. The sidewall spacer SW is formed of, for example, a single-layer insulating film made of a silicon nitride film or a stacked structure of a silicon nitride film and a silicon oxide film.

A trench is provided in a region of the fin FA exposed from the sidewall spacer SW, and a bottom portion of the trench is positioned slightly higher than a surface of the element isolation portion STI. An epitaxial layer EP is formed in the trench. As shown in the A-A cross-section, the epitaxial layer EP is formed so as to fill the trench, and is formed to a position higher than the upper surface of the fin FA on which the memory gate electrode MG and the control gate electrode CG are formed.

An n-type impurity is introduced into the entire epitaxial layer EP. Therefore, the epitaxial layer EP is a diffusion region MD which is a part of the drain region of the memory cell MC or a diffusion region MS which is a part of the source region of the memory cell MC. By providing such an epitaxial layer EP, the contact area between the diffusion region MD and the diffusion region MS and the plug formed in the interlayer insulating film IL can be increased.

In the fin FA, an extension region EXD and an extension region EXS, which are n-type impurity regions, are formed so as to surround the epitaxial layer EP which is the diffusion region MD and the diffusion region MS. The extension region EXS is connected to the diffusion region MS and functions as a part of the source region of the memory cell MC. The extension region EXD is connected to the diffusion region MD and functions as a part of the drain region of the memory cell MC.

A silicide layer SI1 is formed on the epitaxial layer EP for the purpose of reducing the contact resistance with the plug. The silicide layer SI1 is made of, for example, nickel silicide (NiSi), nickel platinum silicide (NiPtSi), or cobalt silicide ($CoSi_2$).

An etching stopper film ES made of an insulating film such as a silicon nitride film is formed on the upper surface and the side surface of the epitaxial layer EP. A part of the etching stopper film ES is also formed on the side surface of the sidewall spacer SW.

An interlayer insulating film IL1 made of, for example, a silicon oxide film is formed on the etching stopper film ES. The interlayer insulating film IL1 is polished by a CMP (Chemical Mechanical Polishing) method. Therefore, the interlayer insulating film IL1 does not cover the entire memory cell MC, and the upper surface of the silicide layer SI2 on the memory gate electrode MG, the upper surface of the silicide layer SI2 on the control gate electrode CG, the upper portion of the gate insulating film GF1, the upper portion of the sidewall spacer SW, and the upper portion of the etching stopper film ES are exposed from the interlayer insulating film IL1.

Although not shown, wires serving as bit lines and wirings serving as source lines are formed over the interlayer insulating film IL1, and plugs for being electrically connected to these wirings are provided in the interlayer insulating film IL1 and the etching stopper film ES.

Operation of Nonvolatile Memory

Next, an operation example of the nonvolatile memory will be described with reference to FIGS. 4 and 5.

Figures 4, 5:
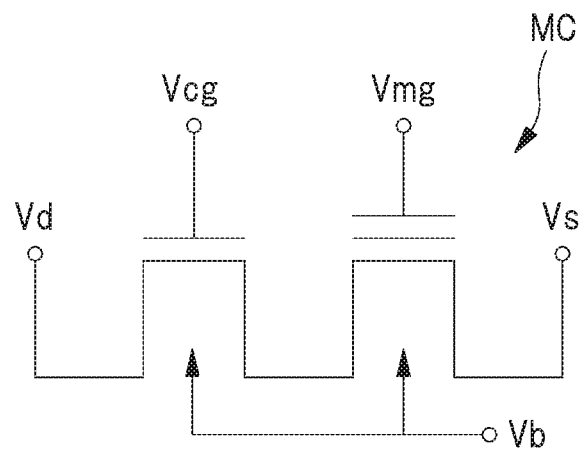
FIG. 4 is an equivalent circuit diagram of a memory cell.
FIG. 5 is a table illustrating an example of a condition for applying a voltage to each part of a selected memory cell during "write", "erase" and "read".

FIG. 4 is an equivalent circuit diagram of the memory cell MC of the nonvolatile memory. FIG. 5 is a table showing an example of a condition for applying a voltage to each portion of the selected memory cell MC at the time of "write", "erase" and "read". In the table of FIG. 5, a voltage Vd applied to the diffusion region MD which is a drain region, a voltage Vcg applied to the control gate electrode CG, a voltage Vmg applied to the memory gate electrode MG, a voltage Vs applied to the diffusion region MS which is a source region, and a voltage Vb applied to the well region PW are described in each of "write", "erase", and "read".

Note that what is shown in the table of FIG. 5 is a suitable example of the voltage application condition, and is not limited to this, and can be variously changed as necessary. In the present embodiment, injection of electrons into the charge storage layer CSL is defined as "writing", and injection of holes into the charge storage layer CSL is defined as "erasing".

The write operation is performed by a write method using hot electron injection by source side injection which is referred to as a Source Side Injection method. For example, writing is performed by applying a voltage as shown in the column of "write" in FIG. 5 to each portion of the selected memory cell MC to which writing is performed, and injecting electrons into the charge storage layer CSL of the selected memory cell MC.

At this time, hot electrons are generated in a channel region of the fin FA covered with the memory gate electrode MG and the control gate electrode CG, and hot electrons are injected into the charge storage layer CSL under the memory gate electrode MG. The injected hot electrons are captured by the trap level in the charge storage layer CSL, and as a result, the threshold voltage of the memory transistor having the memory gate electrode MG rises. That is, the memory transistor is in the write state.

The erase operation is performed by an erase method using hot hole injections by BTBT, which is called a Band to Band Tunneling method. That is, the charge storage layer CSL is erased by injecting holes generated by the BTBT into the charge storage layer CSL. For example, voltages as shown in the column of "erase" in FIG. 5 are applied to respective portions of the selected memory cell MC to be erased, holes are generated by BTBT phenomena, and holes are injected into the charge storage layers CSL of the selected memory cells MC by electric field acceleration. As a result, the threshold voltage of the memory transistor is lowered. That is, the memory transistor is in the erased state.

In the read operation, for example, a voltage as shown in the column of "read" in FIG. 5 is applied to each portion of the selected memory cell MC to be read. By setting the voltage Vmg applied to the memory gate electrode MG at the time of reading to a value between the threshold voltage of the memory transistor in the write state and the threshold voltage of the memory transistor in the erased state, it is possible to discriminate between the write state and the erased state.

Manufacturing Process of Semiconductor Device

Hereinafter, a method of manufacturing a semiconductor device according to the present embodiment will be described with reference to FIGS. 6 to 21.

First, a manufacturing process of the fin FA will be described with reference to FIGS. 6 to 11. FIGS. 6 to 11 are perspective views during the manufacturing process, and FIGS. 12 to 21 are cross-sectional views during the manufacturing process.

Figure 6:
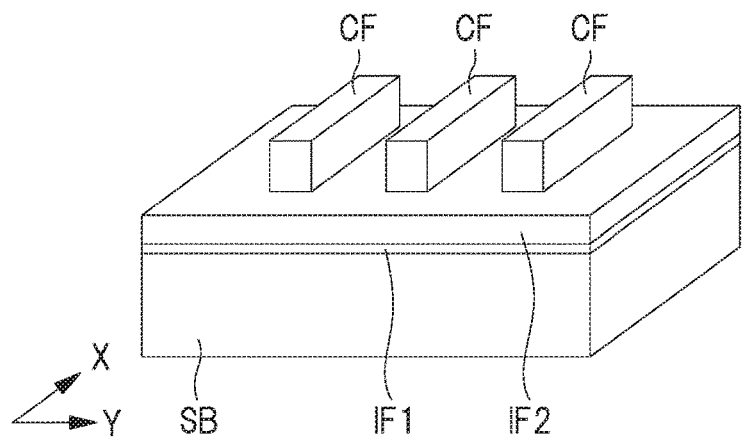
FIG. 6 is a perspective view illustrating a manufacturing process of the semiconductor device of the first embodiment.

As shown in FIG. 6, the semiconductor substrate SB is prepared, and the insulating film IF1, the insulating film IF2, and the conductive film CF are formed in this order on the main surface of the semiconductor substrate SB. The semiconductor substrate SB is made of, for example, p-type single crystal silicon having a resistivity of about 1 to 10 Ωcm. The insulating film IF1 is made of, for example, silicon oxide, and can be formed by, for example, a thermal oxidation method or a CVD (Chemical Vapor Deposition) method. The thickness of the insulating film IF1 is about 2 to 10 nm. The insulating film IF2 is made of, for example, silicon nitride, and is formed by, for example, a CVD method. The thickness of the insulating film IF2 is about 20 to 100 nm. The conductive film CF is made of, for example, silicon, and is formed by, for example, a CVD method. The thickness of the conductive film CF is about 20 to 200 nm. Next, the conductive film CF is processed by photolithography and etching. As a result, a plurality of patterns of conductive films CF extending in the X direction are formed on the insulating film IF2 side by side in the Y direction.

Figure 7:
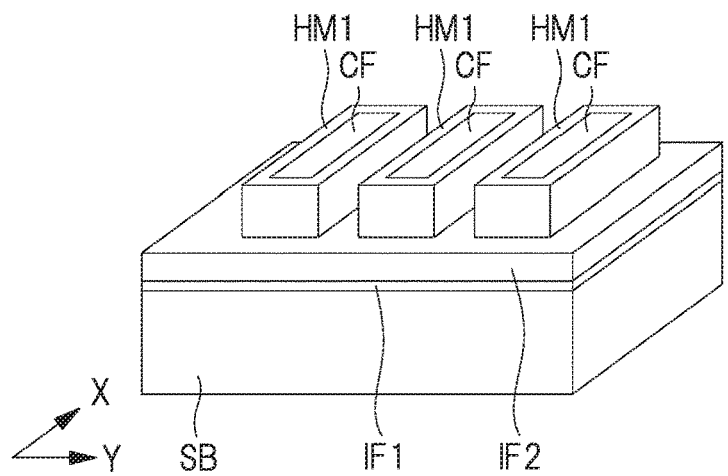
FIG. 7 is a perspective view illustrating a manufacturing process following FIG. 6.

Next, as shown in FIG. 7, hard masks HM1 are formed to cover the side surfaces of each of the plurality of conductive films CF. Here, for example, a silicon oxide film having a thickness of 10 to 40 nm is formed on the insulating film IF2 by a CVD method, and then anisotropic etching is performed on the silicon oxide film. As a result, the hard masks HM1 remaining on the side surfaces of the conductive film CF are formed so as to expose the upper surfaces of the insulating film IF2 and the conductive film CF. The hard masks HM1 are not completely buried between the adjacent conductive films CF, but are formed in an annular shape so as to surround each conductive film CF.

Figure 8:
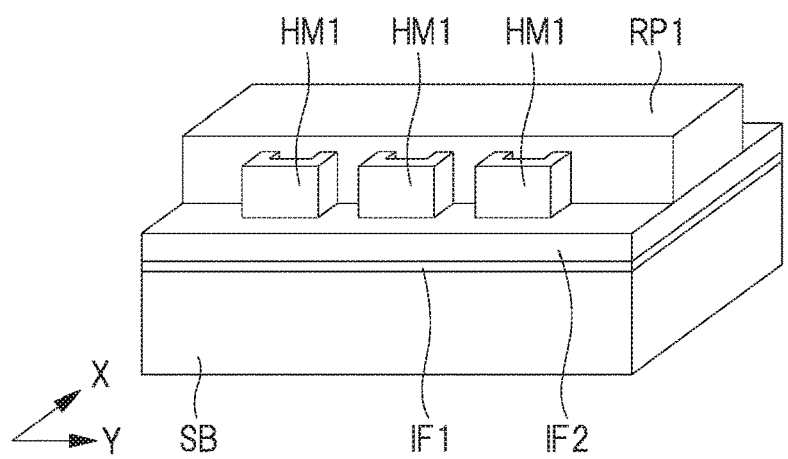
FIG. 8 is a perspective view illustrating a manufacturing process following FIG. 7.

Next, as shown in FIG. 8, the conductive film CF is removed by wet etching. As a result, the annular hard masks HM1 are left on the insulating film IF2. Next, a resist pattern RP1 is formed to cover a part of the hard masks HM1. The resist pattern RP1 has a pattern that covers a portion of the hard masks HM1 that extends in the X direction and exposes a portion that extends in the Y direction. That is, both ends of the hard masks HM1 in the X direction are exposed from the resist pattern RP1.

Figure 9:
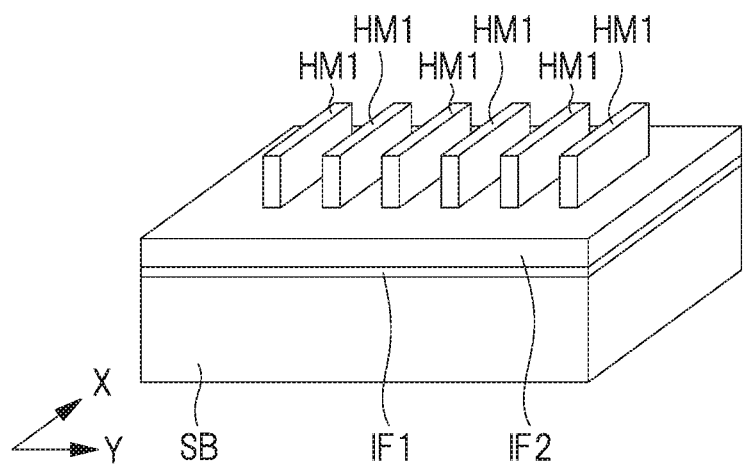
FIG. 9 is a perspective view illustrating a manufacturing process following FIG. 8.

Next, as shown in FIG. 9, by etching using the resist pattern RP1 as a mask, a part of the hard masks HM1 is removed. As a result, only a portion of the hard masks HM1 extending in the X direction remains. That is, on the insulating film IF2, a plurality of hard masks HM1, which are patterns extending in the X direction, are arranged side by side in the Y direction. Thereafter, the resist pattern RP1 is removed by asking processing or the like.

Figure 10:
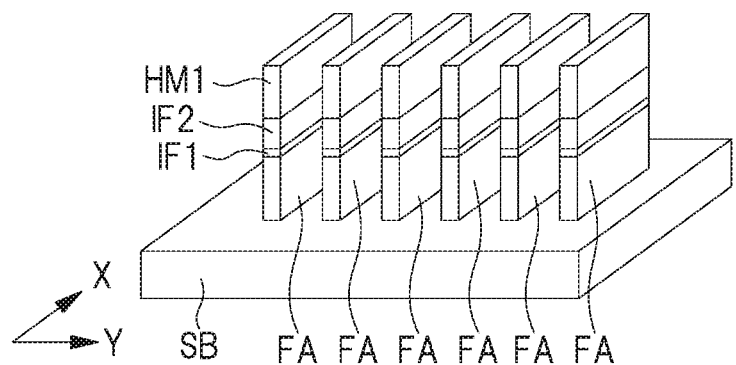
FIG. 10 is a perspective view illustrating a manufacturing process following FIG. 9.

Next, as shown in FIG. 10, anisotropic etching is performed to the insulating film IF2, the insulating film IF1, and the semiconductor substrate SB using the hard masks HM1 as a mask. As a result, a fin FA that protrudes from the semiconductor substrate SB and is a pattern that is a part of the semiconductor substrate SB is formed immediately below the hard masks HM1. The height of the fin FA is about 100 to 250 nm, and the width of the fin FA in the Y direction is about 10 to 50 nm.

Figure 11:
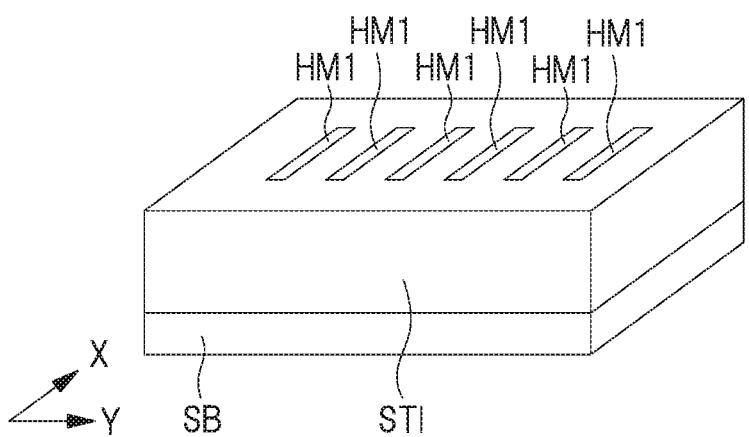
FIG. 11 is a perspective view illustrating a manufacturing process following FIG. 10.

Next, as shown in FIG. 11, an insulating film made of a silicon oxide film or the like is deposited on the semiconductor substrate SB so as to fill a space between the fins FA, the insulating films IF1, the insulating films IF2, and the hard masks HM1. Subsequently, the insulating film is polished by a CMP method to expose the upper surface of the hard masks HM1. As a result, the element isolation portion STI formed of the insulating film is formed.

The manufacturing process subsequent to FIG. 11 will be described with reference to FIGS. 12 to 21. FIGS. 12 to 21 show cross-sectional views corresponding to line A-A of FIG. 1 and cross-sectional views corresponding to line B-B of FIG. 1.

Figure 12:
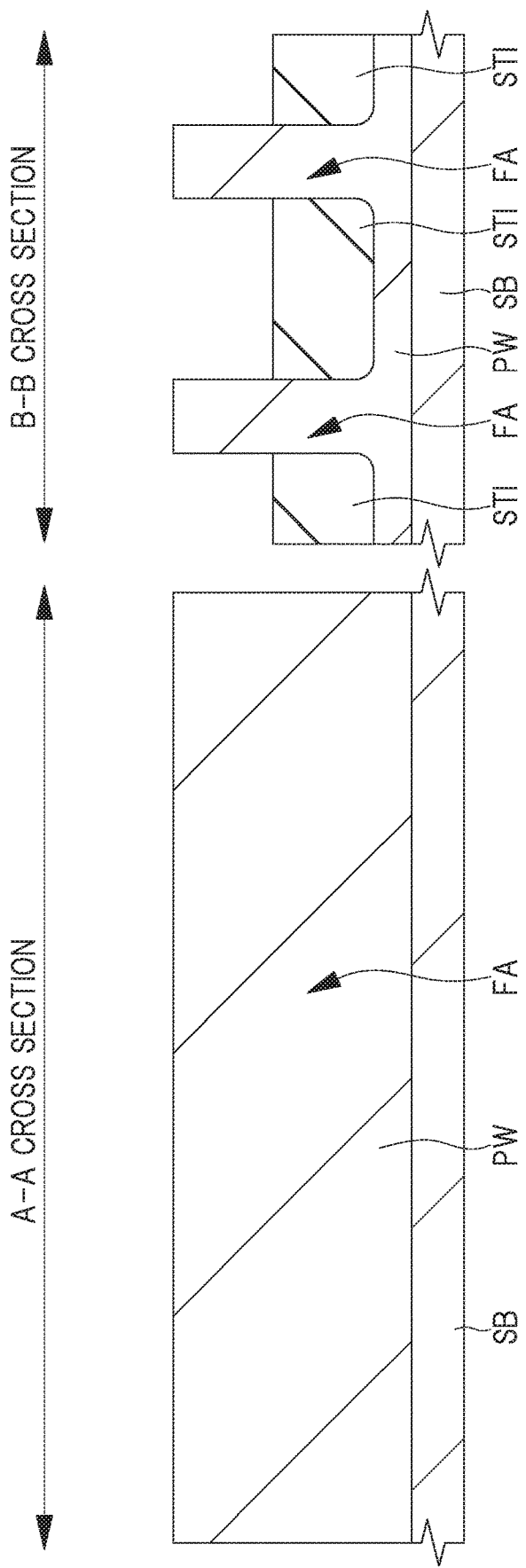
FIG. 12 is a cross-sectional view illustrating a manufacturing process following FIG. 11.

As shown in FIG. 12, first, the hard masks HM1, the insulating film IF1, and the insulating film IF2 are removed. Next, an etching process is performed on the upper surface of the element isolation portion STI, whereby the upper surface of the element isolation portion STI is retracted in the height direction. As a result, a part of the side surface and the upper surface of the fin FA are exposed.

Next, a p-type well region PW is formed in the fin FA and the semiconductor substrate SB by introducing an impurity into the semiconductor substrate SB including the fin FA by a photolithography method, an ion implantation method, or the like. The impurity for forming the p-type well regions PW is, for example, boron (B) or boron difluoride ($BF_2$). The well region PW is formed to extend over the entire fin FA and a part of the semiconductor substrate SB.

Figure 13:
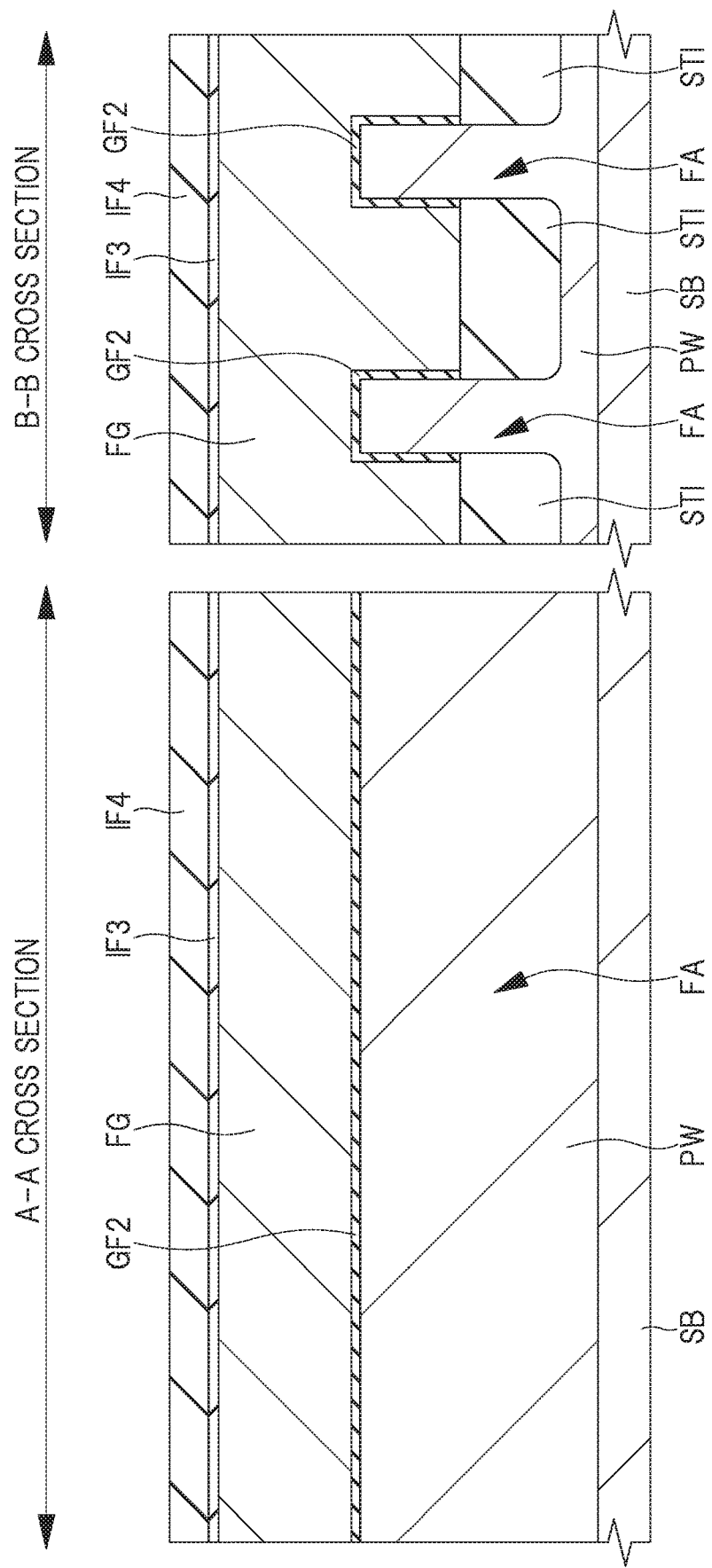
FIG. 13 is a cross-sectional view illustrating a manufacturing process following FIG. 12.

FIG. 13 shows the steps of forming the gate insulating film GF2, the conductive film FG, the insulating film IF3, and the insulating film IF4.

First, a gate insulating film GF2 made of, for example, silicon oxide is formed on the upper surface and the side surface of the fin FA by, for example, thermal oxidation. The thickness of the gate insulating film GF2 is about 2 to 4 nm. Instead of the silicon oxide film, a metal oxide film such as a hafnium oxide film may be formed as the gate insulating film GF2 by, for example, an ALD (Atomic Layer Deposition) method.

Next, a conductive film FG made of, for example, a polycrystalline silicon film is deposited by, for example, a CVD method so as to cover the upper surface and the side surface of the fin FA with the gate insulating film GF2 interposed therebetween. Next, the upper surface of the conductive film FG is flattened by a CMP method. At the time when this polishing step is completed, the upper surface and the side surface of the fin FA in the B-B cross section are covered with the conductive film FG via the gate insulating film GF2.

Next, an insulating film IF3 made of, for example, silicon oxide and an insulating film IF4 made of, for example, silicon nitride are sequentially formed on the conductive film FG by, for example, a CVD method.

Figure 14:
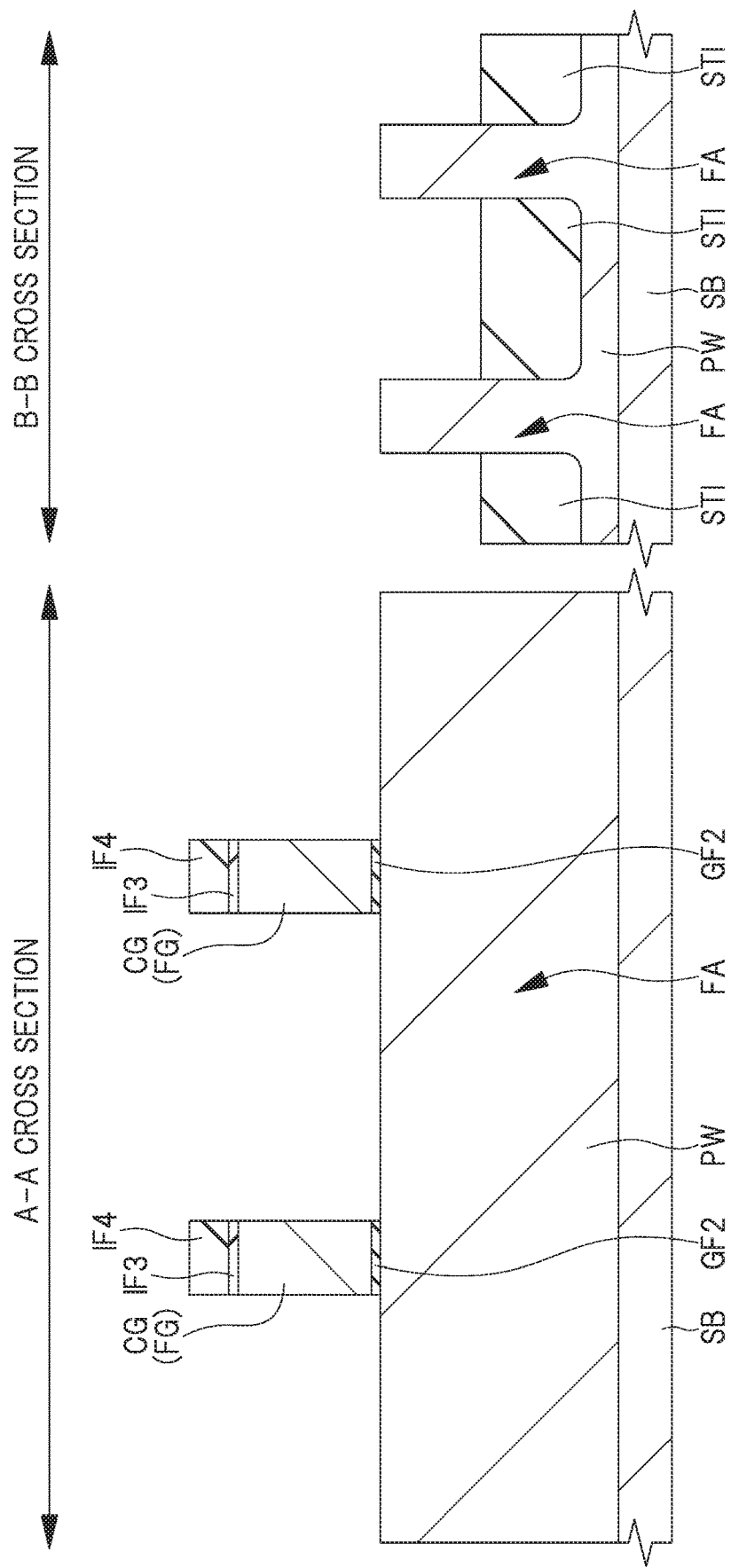
FIG. 14 is a cross-sectional view illustrating a manufacturing process following FIG. 13.

FIG. 14 shows a step of forming the control gate electrode CG.

First, the insulating film IF4 is selectively patterned by photolithography and dry etching. Next, dry etching is performed using the patterned insulating film IF4 as a mask to pattern the insulating film IF3 and the conductive film FG. Thus, the conductive film FG is processed to form the control gate electrode CG. Next, by removing the gate insulating film GF2 exposed from the control gate electrode CG, the gate insulating film GF2 is left under the control gate electrode CG. As shown in FIGS. 1 and 2, the control gate electrode CG is patterned so as to extend in a direction (Y direction) orthogonal to the extending direction (X direction) of the fin FA.

Figure 15:
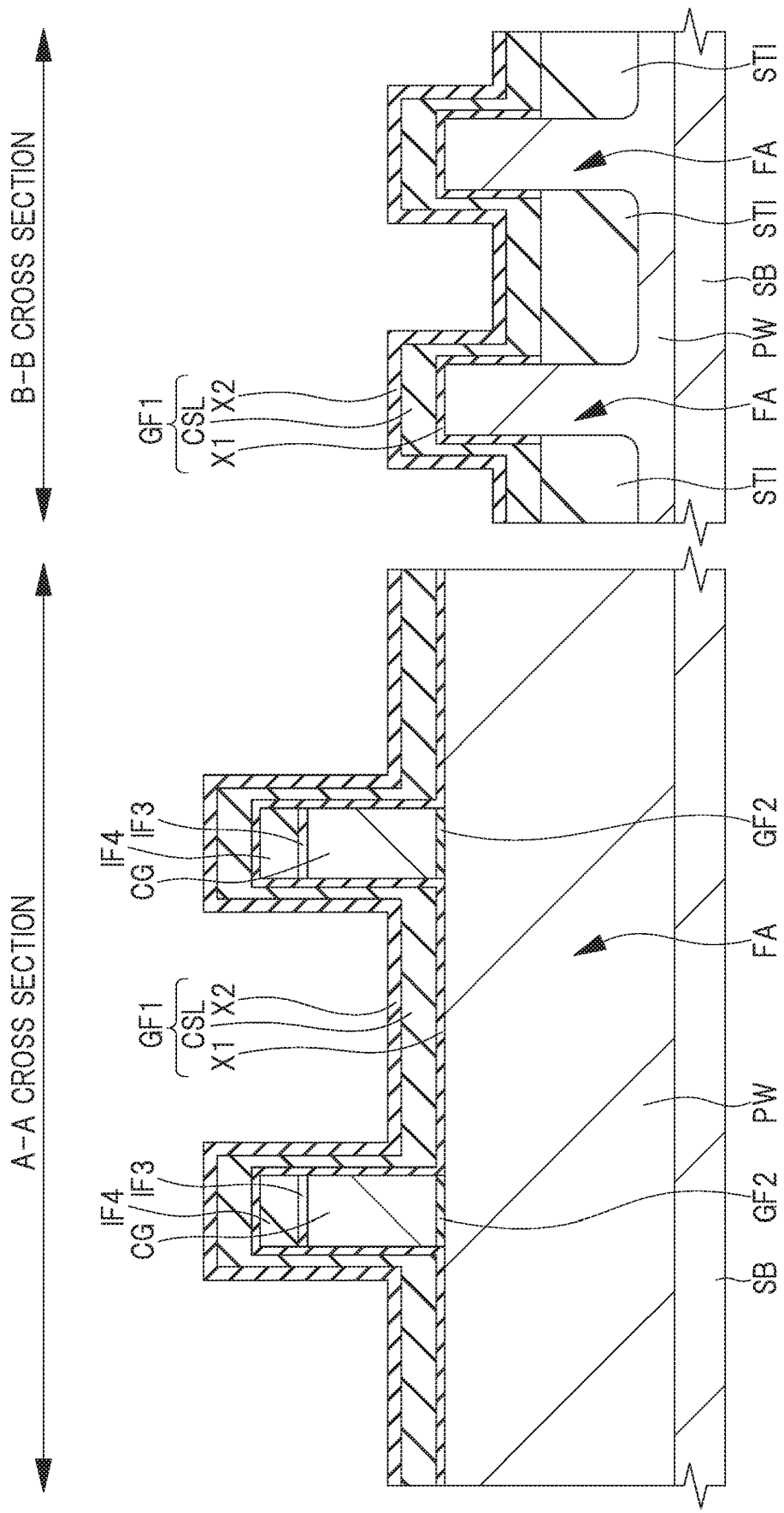
FIG. 15 is a cross-sectional view illustrating a manufacturing process following FIG. 14.

FIG. 15 shows a step of forming the gate insulating film GF1 including the insulating film X1, the charge storage layer CSL, and the insulating film X2.

First, an insulating film X1 which is a part of the gate insulating film GF1 is formed. The insulating film X1 is formed using, for example, an ISSG (In-Situ Steam Generation) method, which is one type of thermal oxidation method, and is made of, for example, silicon oxide and has a thickness of about 3 nm to 5 nm.

The insulating film X1 is formed on the side surface of the control gate electrode CG and the upper surface of the fin FA in the A-A cross section, and is formed on the upper surface and the side surface of the fin FA in the B-B cross section. When the ISSG method is used to form the insulating film X1, the surfaces of the insulating films IF4 formed on the control gate electrodes CG are also oxidized. In present embodiment, an ISSG method is used as the forming method of the insulating film X1. However, the insulating film X1 may be formed by a CVD method as another forming method.

Next, a charge storage layer CSL which is a part of the gate insulating film GF1 is formed. The charge storage layer CSL is a trapping insulating film having a trap level capable of storing charge, and is formed by using, for example, a sputtering method, and is, for example, a metal oxide film containing hafnium (Hf) and silicon (Si). In present embodiment, a hafnium silicate film (HfSiO film) is representatively exemplified as the metal oxide film of the charge storage layer CSL. In this sputtering step, a HfSiO film can be formed by using a HfSiO target, a Hf target and a SiO target, or a $HfO_2$ target and a Si target. As another method of the sputtering process, a HfSiO film can be formed by using a Hf target and a Si target and containing oxygen in a gaseous atmosphere.

The charge storage layer CSL is formed on the upper surface of the insulating film IF4, the side surface of the control gate electrode CG, and the upper surface of the fin FA via the insulating film X1 in the A-A cross section, and is formed on the upper surface and the side surface of the fin FA via the insulating film X1 in the B-B cross section. The charge storage layer CSL is also formed on the upper surface of the element isolation portion STI between the fins FA adjacent to each other in the B-B cross section.

As shown in the B-B cross section, since the charge storage layer CSL of the present embodiment is formed using a sputtering method, the thickness of the charge storage layer CSL formed over the upper surface of the fin FA is larger than the thickness of the charge storage layer CSL formed over the side surface of the fin FA. For example, the thickness of the charge storage layer CSL formed over the upper surface of the fin FA is about 10 to 28 nm, and the thickness of the charge storage layer CSL formed over the side surface of the fin FA is about 5 to 7 nm.

Next, an insulating film X2 which is a part of the gate insulating film GF1 is formed on the charge storage layer CSL. The insulating film X2 is formed by, for example, a CVD method or an ALD (Atomic Layer Deposition) method, and is an insulating film made of a metal oxide film containing aluminum (Al), such as an aluminum oxide film (AlO film), and has a thickness of about 8 nm to 10 nm.

Figure 16:
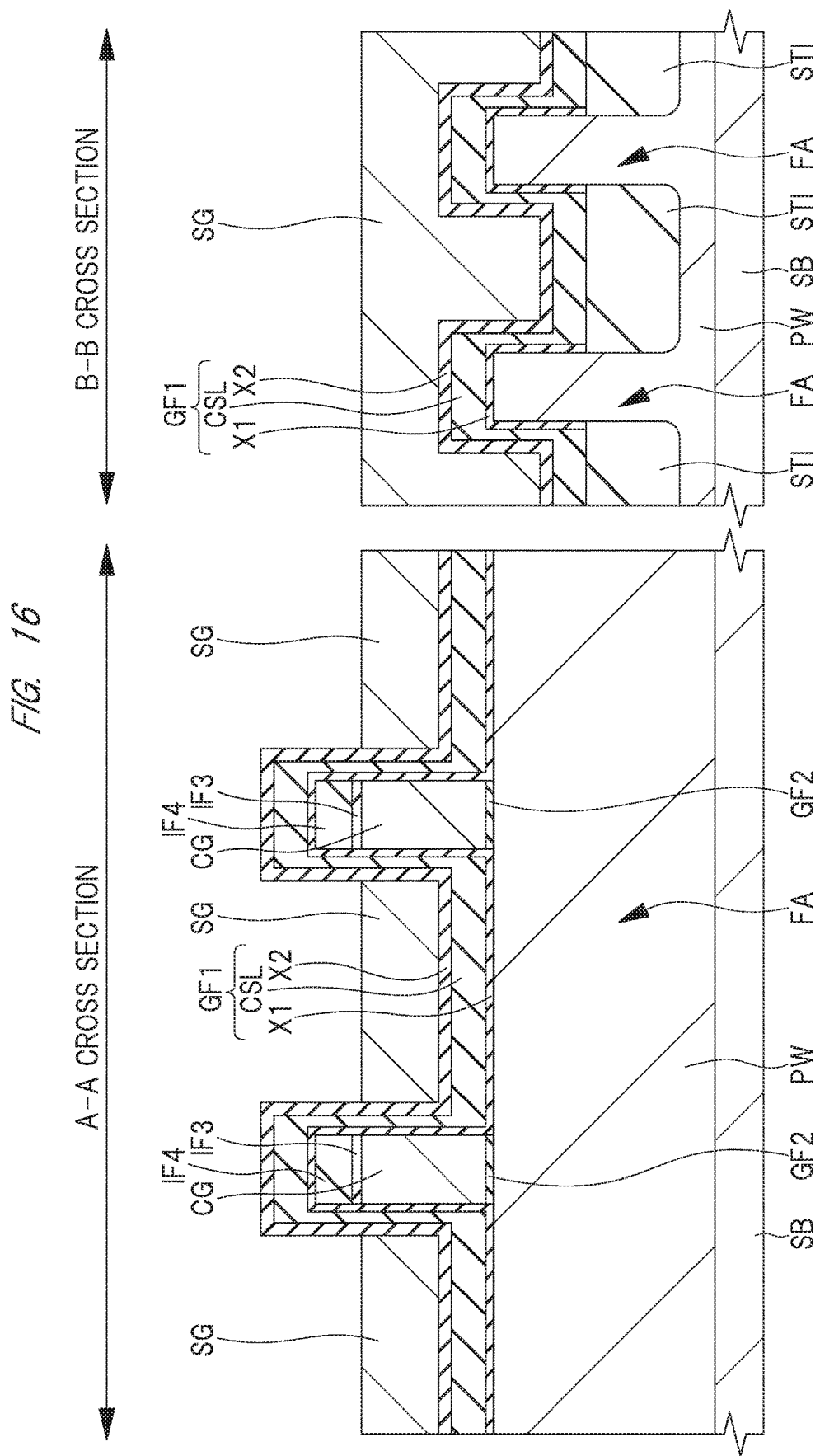
FIG. 16 is a cross-sectional view illustrating a manufacturing process following FIG. 15.

FIG. 16 shows a step of forming the conductive film SG.

First, a conductive film SG made of, for example, polycrystalline silicon is deposited on the insulating film X2 by, for example, a CVD method. Next, the conductive film SG is polished by a CMP method to fill the space between the adjacent control gate electrodes CG with the conductive film SG. Next, dry etching is performed to retract the surface of the conductive film SG. At this time, the conductive film SG is etched so that a part of the gate insulating film GF2 is exposed in the A-A cross section and is lower than the upper surface of the insulating film IF4, and is etched so that the gate insulating film GF2 is not exposed in the B-B cross section.

Figure 17:
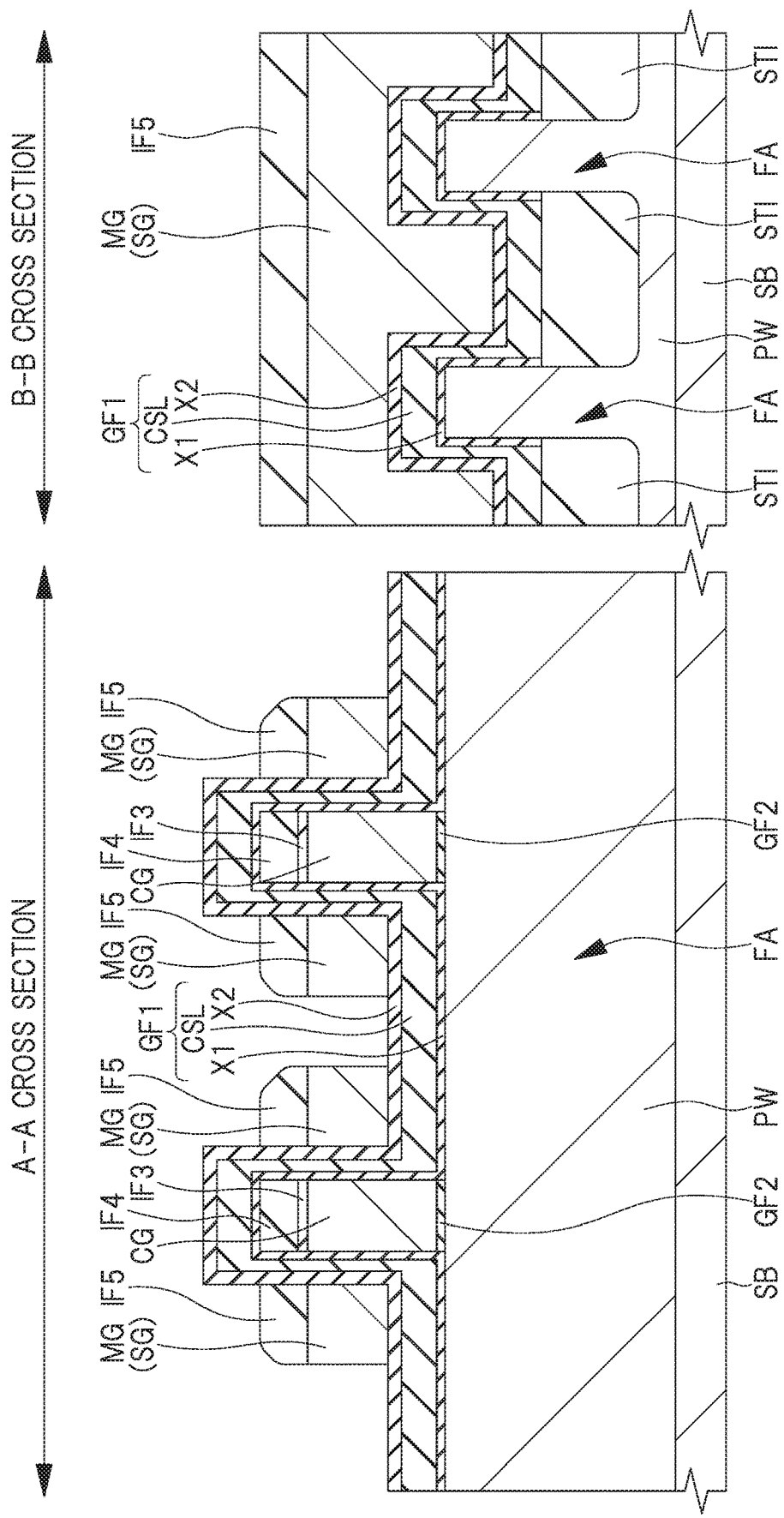
FIG. 17 is a cross-sectional view illustrating a manufacturing process following FIG. 16.

FIG. 17 shows a step of forming the insulating film IF5 and the memory gate electrode MG.

First, an insulating film IF5 made of, for example, silicon nitride is formed on the recessed conductive film SG and the gate insulating film GF1 by, for example, a CVD method. Next, anisotropic etching is performed to process the insulating film IF5 into a sidewall shape. Next, dry etching is performed using the processed insulating film IF5 as a mask to remove the conductive film SG not covered with the insulating film IF5, thereby forming the memory gate electrode MG.

Figure 18:
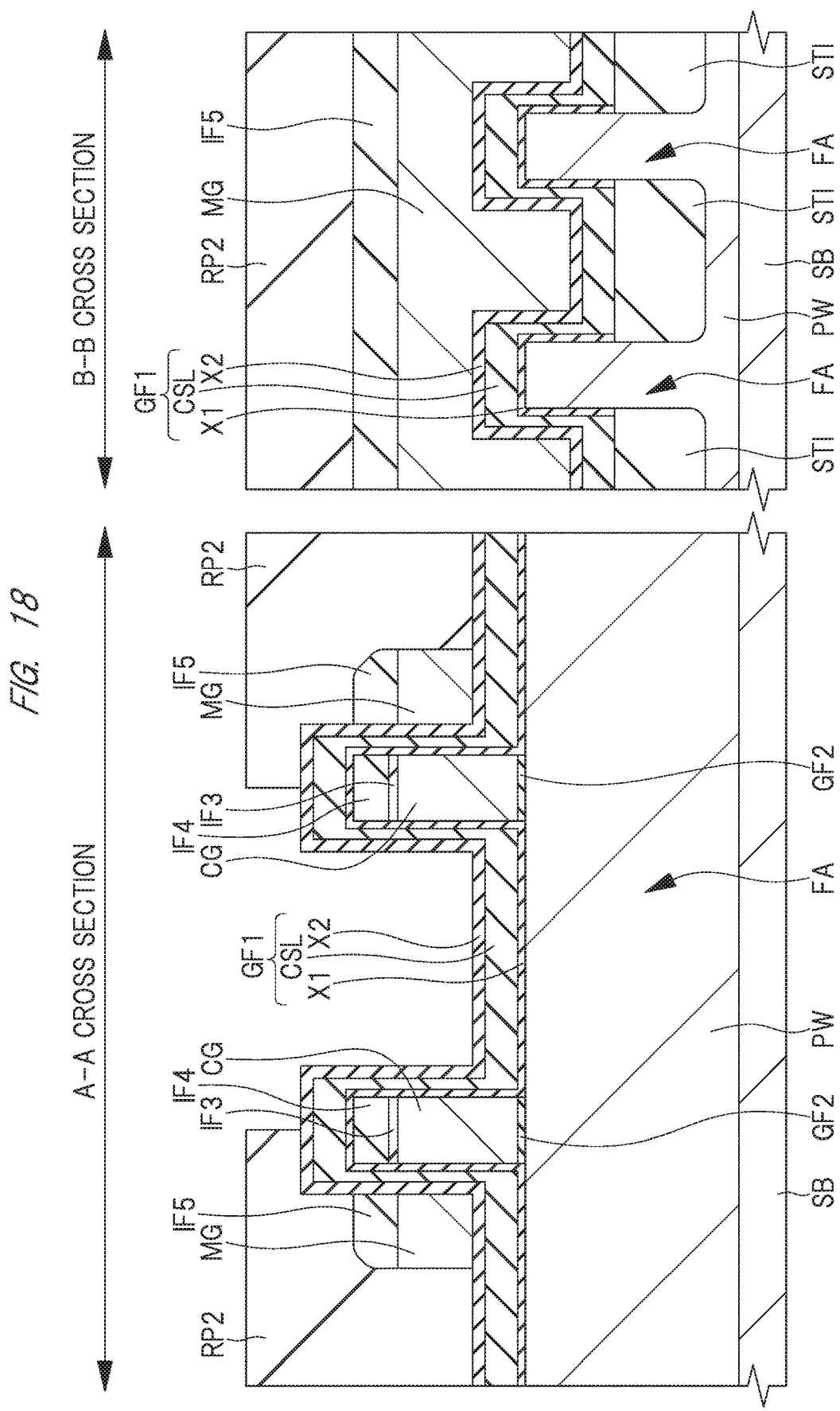
FIG. 18 is a cross-sectional view illustrating a manufacturing process following FIG. 17.

FIG. 18 shows a step of removing a part of the insulating film IF5 and a part of the memory gate electrode MG.

First, a resist pattern RP2 is formed to cover the memory gate electrode MG formed on one side surface of the control gate electrode CG. Next, dry etching processing and wet etching processing are performed using the resist pattern RP2 as a mask to remove the insulating film IF5 and the memory gate electrode MG that are not covered by the resist pattern RP2. Thereby, the insulating film IF5 and the memory gate electrode MG on the drain region side of the memory cell MC are removed, and the insulating film IF5 and the memory gate electrode MG on the source region side of the memory cell MC are left. Thereafter, the resist pattern RP2 is removed by asking processing or the like.

Figure 19:
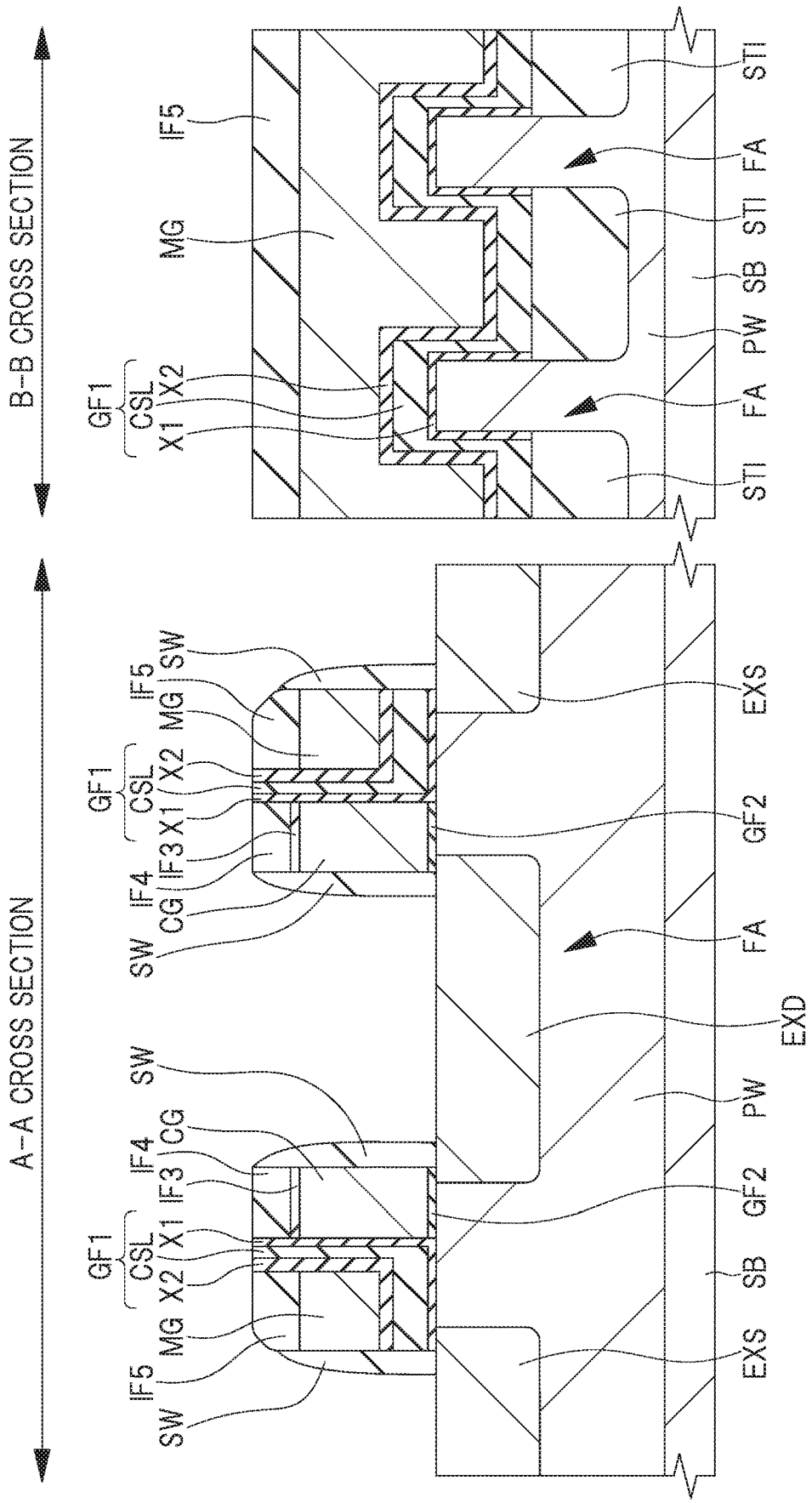
FIG. 19 is a cross-sectional view illustrating a manufacturing process following FIG. 18.

FIG. 19 shows a step of forming the extension region EXD, the extension region EXS, and the sidewall spacer SW.

First, dry etching processing and wet etching processing are performed to sequentially remove the insulating film X2, the charge storage layer CSL, and the insulating film X1 in the other regions so as to leave the insulating film X2, the charge storage layer CSL, and the insulating film X1 formed between the control gate electrode CG and the memory gate electrode MG and between the memory gate electrode MG and the fin FA.

Next, arsenic (As) or phosphorus (P), for example, is introduced into the fin FA by photolithography and ion implantation to form an n-type extension region (impurity region) EXD and an n-type extension region (impurity region) EXS in the fin FA. The extension region EXD and the extension region EXS are formed in self-alignment with the control gate electrode CG and the memory gate electrode MG.

Next, an insulating film made of, for example, silicon nitride is formed by, for example, a CVD method so as to cover the memory cell MC. Next, anisotropic dry etching processing is performed on the insulating film to form the sidewall spacer SW on the side surface of the control gate electrode CG and the memory gate electrode MG.

Figure 20:
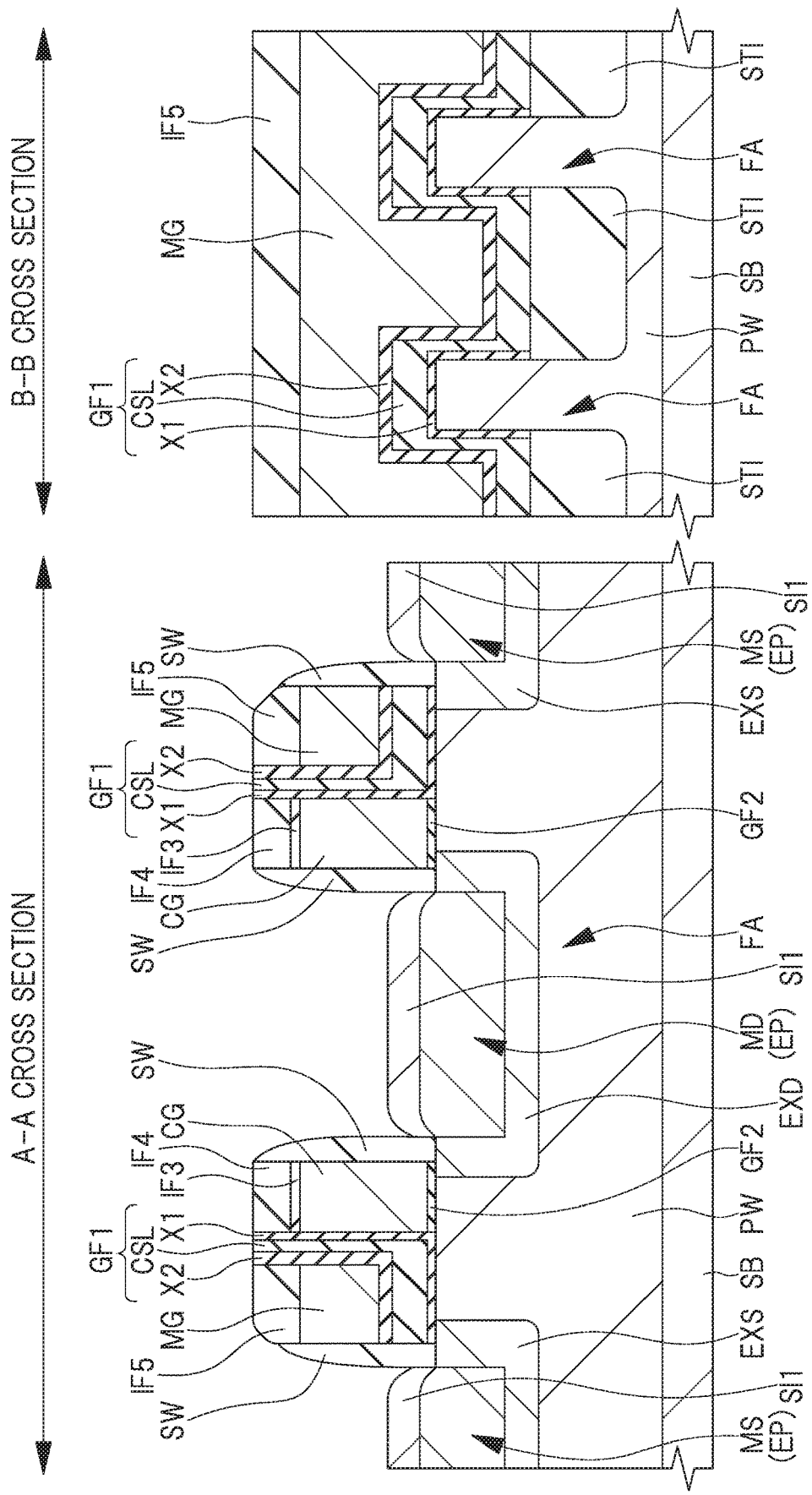
FIG. 20 is a cross-sectional view illustrating a manufacturing process following FIG. 19.

FIG. 20 shows the steps of forming the epitaxial layer EP, the diffusion region MD, the diffusion region MS, and the silicide layer SI1.

First, dry etching processing is performed using the sidewall spacer SW as a mask, whereby the upper surface of the fin FA is retracted to form a trench in the fin FA. As a result, the upper surface of the retracted fin FA is positioned higher than the upper surface of the element isolation portion STI and lower than the upper surface of the fin FA immediately below each of the control gate electrode CG and the memory gate electrode MG.

Next, an epitaxial layer EP made of, for example, silicon is formed by an epitaxial growth method so as to fill the trench. At this time, the epitaxial layer EP is grown until the upper surface of the epitaxial layer EP is higher than the upper surface of the fin FA immediately under each of the control gate electrode CG and the memory gate electrode MG.

Next, an n-type impurity is introduced into each epitaxial layer EP by photolithography and ion implantation, and thereafter, heat treatment for activation of the impurity is performed. As a result, the epitaxial layer EP becomes an n-type impurity region. In present embodiment, the epitaxial layer EP serving as a drain region is shown as an n-type diffusion region MD, and the epitaxial layer EP serving as a source region is shown as an n-type diffusion region MS. The impurity concentrations of the diffusion region MD and the diffusion region MS are larger than the impurity concentrations of the extension region EXD and the extension region EXS, respectively.

Alternatively, the epitaxial layer EP may be grown as a silicon layer containing an n-type impurity by mixing a gas which contains an impurity exhibiting n-type conductivity with a deposition gas used in the above epitaxial growth method. In this case, the above ion implantation is unnecessary.

Next, low-resistance silicide layers SI1 are formed on the diffusion regions MD and MS by a Salicide (Self Aligned Silicide) technique.

Specifically, the silicide layer SI1 can be formed as follows. First, a silicon oxide film, for example, is formed as an insulating film for preventing the formation of the silicide layer SI1 over the entire main surface of the semiconductor substrate SB by a CVD method. Next, the insulating film is selectively patterned to open only the region where the silicide layer is to be formed. Next, a metal film for forming the silicide layer SI1 is formed so as to cover the entire main surface of the semiconductor substrate SB. The metal film is made of, for example, cobalt, nickel, or nickel platinum alloy. Next, the semiconductor substrate SB is subjected to a first heat treatment at about 300 to 400° C., and then subjected to a second heat treatment at about 600 to 700° C., so that the materials included in the diffusion regions MD and MS react with the metal film. As a result, silicide layer SI1 made of cobalt silicide ($CoSi_2$), nickel silicide (NiSi) or nickel platinum silicide (NiPtSi) is formed on the diffusion regions MD and MS. Thereafter, the unreacted metal film is removed, and subsequently, the insulating film for preventing formation of the silicide layer SI1 is removed by wet etching processing.

Figure 21:
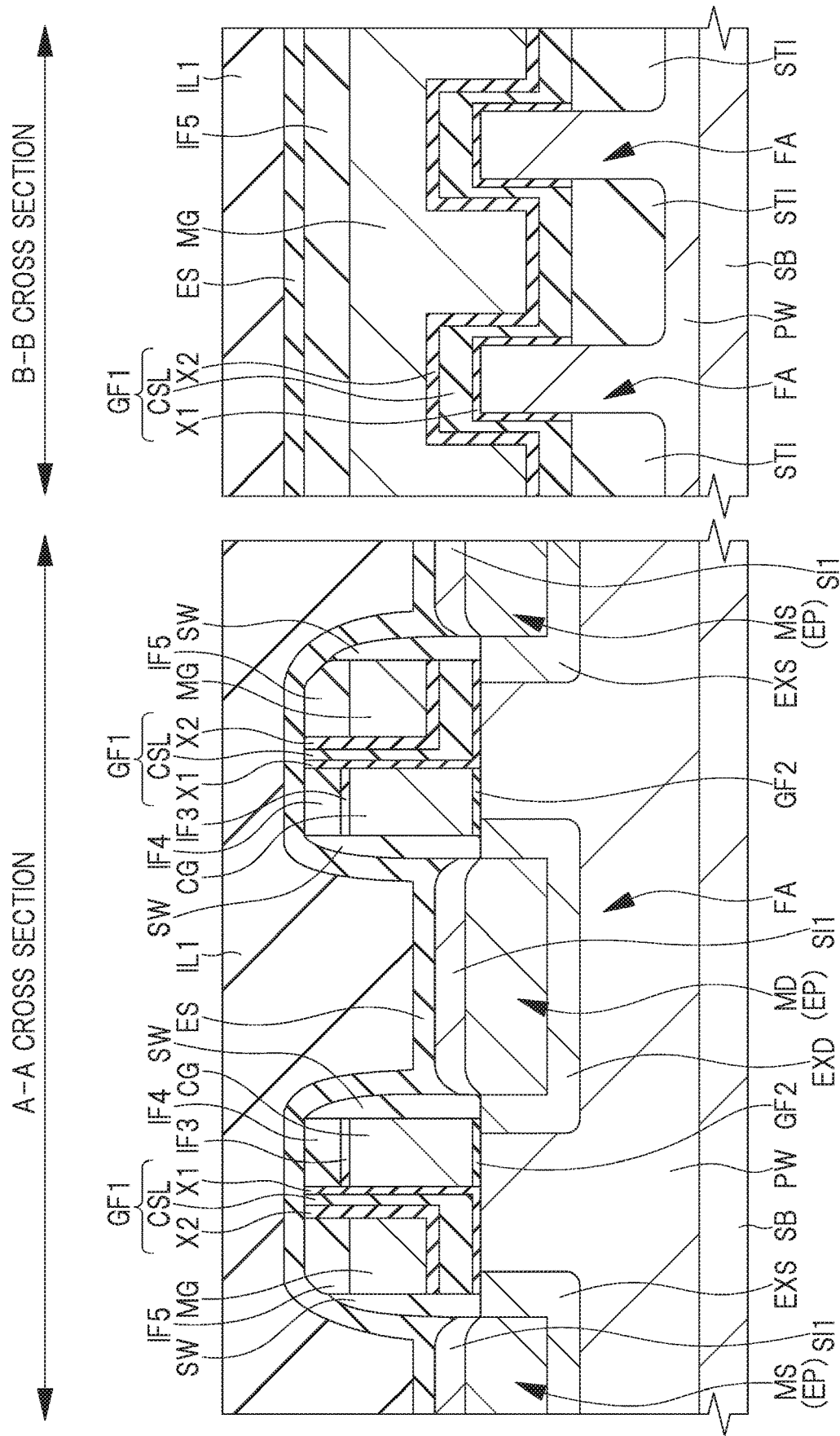
FIG. 21 is a cross-sectional view illustrating a manufacturing process following FIG. 20.

FIG. 21 shows a step of forming the etching stopper film ES and the interlayer insulating film IL1.

First, an etching stopper film ES made of, for example, silicon nitride is formed by, for example, a CVD method so as to cover the memory cell MC. Next, an interlayer insulating film IL1 made of, for example, silicon oxide is formed on the etching stopper film ES by, for example, a CVD method.

Thereafter, the semiconductor device shown in FIG. 3 is manufactured through the following manufacturing process.

First, the interlayer insulating film IL1 is polished by a CMP method until the etching stopper film ES is exposed. Thereafter, by further continuing the polishing process, the etching stopper film ES, the insulating film IF4 and the insulating film IF3 over the control gate electrode CG, and the insulating film IF5 over the memory gate electrode MG are also polished. Part of the control gate electrode CG and the memory gate electrode MG is also exposed to the polishing treatment, and the upper surfaces of the control gate electrode CG and the memory gate electrode MG are exposed.

Next, a silicide layer SI2 is formed on each of the control gate electrode CG and the memory gate electrode MG by the same method as in the step of forming the silicide layer SI1 described above with reference to FIG. 20. The silicide layers SI2 are made of, for example, cobalt silicide ($CoSi_2$), nickel silicide (NiSi), or nickel platinum silicide (NiPtSi).

As described above, the semiconductor device shown in FIG. 3 is manufactured.

Regarding Main Feature of Semiconductor Device in Present Embodiment

Figure 22:
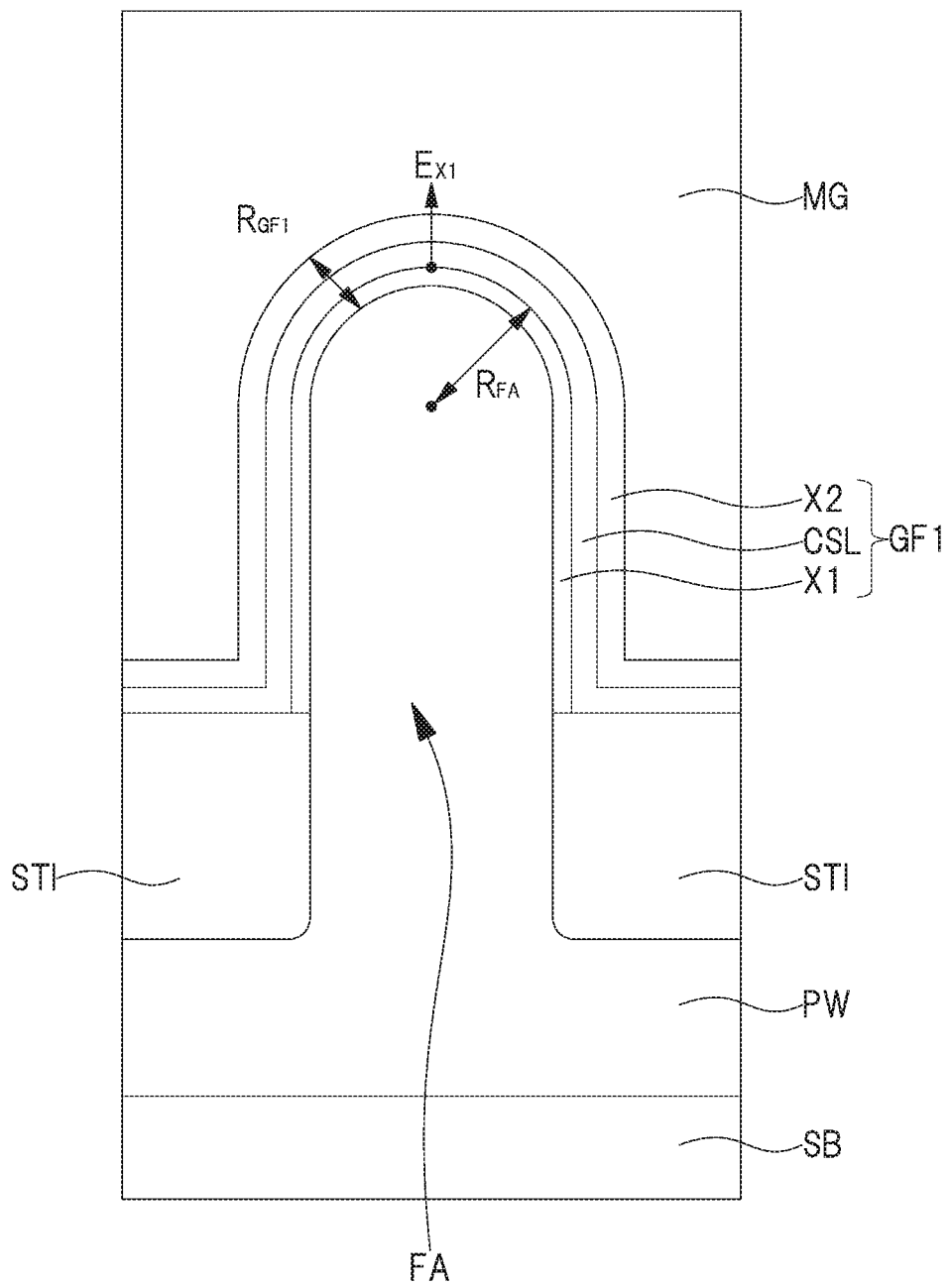
FIG. 22 is a diagram of an electric field simulation considered by the inventor of the present application.

FIG. 22 is an explanatory view of the electric field simulation studied by the inventor of the present application, and shows a cross-sectional view of one fin FA in the cross-section along the line B-B in FIG. 1. Although FIG. 22 is a cross-sectional view, hatching is omitted in order to make the description easier to understand.

FIG. 22 illustrates an electric field $E_{X1}$ applied to the lowermost portion of the insulating film X1 of the gate insulating film GF1 formed over the upper surface of the fin FA, a radius of curvature $R_{FA}$ of the upper surface of the fin FA, and a thickness $R_{GF1}$ of the gate insulating film GF1. The electric field $E_{X1}$ can be expressed by the following equation (1) using the radii of curvature $R_{FA}$ and the thickness $R_{GF1}$. The voltage $V_{MG}$ is a voltage value applied to the memory gate electrode MG, and the capacitance C is a capacitance value between the memory gate electrode MG and the fin FA.

$$E_{X1} = CV_{MG}/\varepsilon_{TT}R_{FA} = V_{MG}/R_{FA} \cdot \log\{(R_{FA}+R_{GF1})/R_{FA}\} \quad \text{Equation (1)}$$

Here, for example, when the thickness $R_{GF1}$ is 18 nm and the radius of curvature $R_{FA}$ is 10 nm, the electric field $E_{X1}$ applied to the upper surface of the fin FA is about 1.6 times the electric field $E_{X1}$ applied to the side surface of the fin FA. That is, the dielectric breakdown voltage of the insulating film X1 formed on the upper surface of the fin FA is required to be about 1.6 times the dielectric breakdown voltage of the insulating film X1 formed on the side surface of the fin FA. Therefore, in order to equalize these electric fields, it is necessary to set the thickness of the gate insulating film GF1 formed on the upper surface of the fin FA to about 1.6 times the thickness of the gate insulating film GF1 formed on the side surface of the fin FA.

For example, when the thickness of the insulating film X1, the thickness of the charge storage layer CSL, and the thickness of the insulating film X2 are 4 nm, 6 nm, and 8 nm, respectively, on the side surface of the fin FA, the thickness of the insulating film X1, the thickness of the charge storage layer CSL, and the thickness of the insulating film X2 are preferably 4 nm, 17 nm, and 8 nm, respectively, on the upper surface of the fin FA. That is, the thickness of the charge storage layer CSL on the upper surface of the fin FA is preferably about three times the thickness of the charge storage layer CSL on the upper side surface of the fin FA. Such a value can be realized by forming the charge storage layer CSL by a sputtering method.

According to the study by the inventor of the present application, it is preferable that the thickness of the gate insulating film GF2 formed on the upper surface of the fin FA is in the range of 1.3 to 2.0 times the thickness of the gate insulating film GF2 formed on the side surface of the fin FA, and it is preferable that the thickness of the charge storage layer CSL on the upper surface of the fin FA is in the range of 2 to 4 times the thickness of the charge storage layer CSL on the side surface of the fin FA.

Electrons in the write operation of the memory cell MC and holes in the erase operation are injected into the charge storage layer CSL through the insulating film X1. For this reason, damage is accumulated in the insulating film X1 every time rewriting is performed, so that the insulating film X1 is a film which is liable to cause dielectric breakdown due to severe deterioration of the dielectric breakdown voltage as compared with other insulating films.

In order to increase the dielectric breakdown voltage of the insulating film X1 formed on the upper surface of the fin FA, it is also conceivable to increase the thickness of the insulating film X1 itself, but in this case, there is a possibility that the energy for electrons in the writing operation and holes in the erasing operation to pass through the insulating film X1 is insufficient. That is, the injection efficiency of electrons and holes into the charge storage layer CSL may be lowered. In order to improve the injection efficiency, it is conceivable to increase the voltage of the memory gate electrode MG during the write operation and the erase operation, but in this case, it is necessary to provide an extra booster circuit or the like, which prevents miniaturization of the semiconductor device. Therefore, in the present embodiment, the electric field is relaxed by adjusting the thickness of the charge storage layer CSL instead of the thickness of the insulating film X1.

As described above, in the present embodiment, the thickness of the charge storage layer CSL over the upper surface of the fin FA is thicker than the thickness over the side surface of the fin FA. Therefore, the concentration of the electric field applied to the insulating film X1 can be alleviated on the upper surface of the fin FA. Therefore, since the dielectric breakdown voltage of the insulating film X1 can be improved, the reliability of the memory cell MC can be improved.

In addition, by increasing the thickness of the charge storage layer CSL over the upper surface of the fin FA, the amount of trapped charge increases during the write operation of the memory cell MC, so that the rewrite durability and reliability of the memory cell MC can be improved.

In addition, as described with reference to FIG. 15, in order to separately form the thickness of the charge storage layer CSL as described above, a sputtering method is used in the present embodiment. For example, although a CVD method or an ALD method is effective in enhancing the uniformity of the thickness, it is difficult to make a difference of about 2 to 4 times in the thickness of the charge storage layer CSL at a desired position as in the present embodiment. Further, it is difficult to make a difference of about 2 to 4 times in the thickness of the charge storage layer CSL at a desired position by one film forming process. In present embodiment, by forming the charge storage layer CSL by a sputtering method, the charge storage layer CSL can be formed by a single film formation step, and the thickness of the charge storage layer CSL can be made different from each other over the upper surface and the side surface of the fin FA. Therefore, in the present embodiment, the manufacturing process can be simplified.

Second Embodiment

Figure 23:
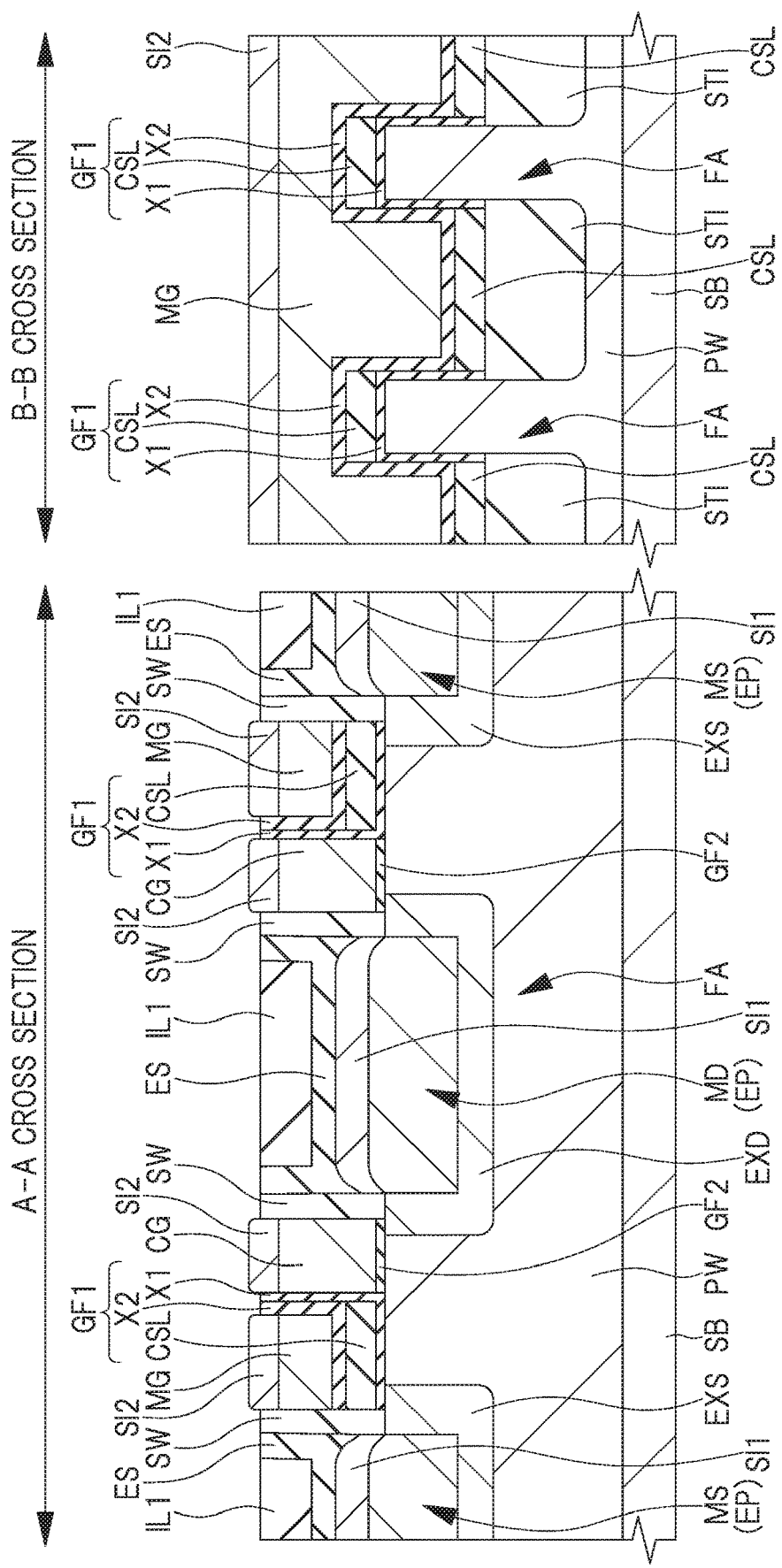
FIG. 23 is a cross-sectional view illustrating a semiconductor device according to a second embodiment.
Figure 24:
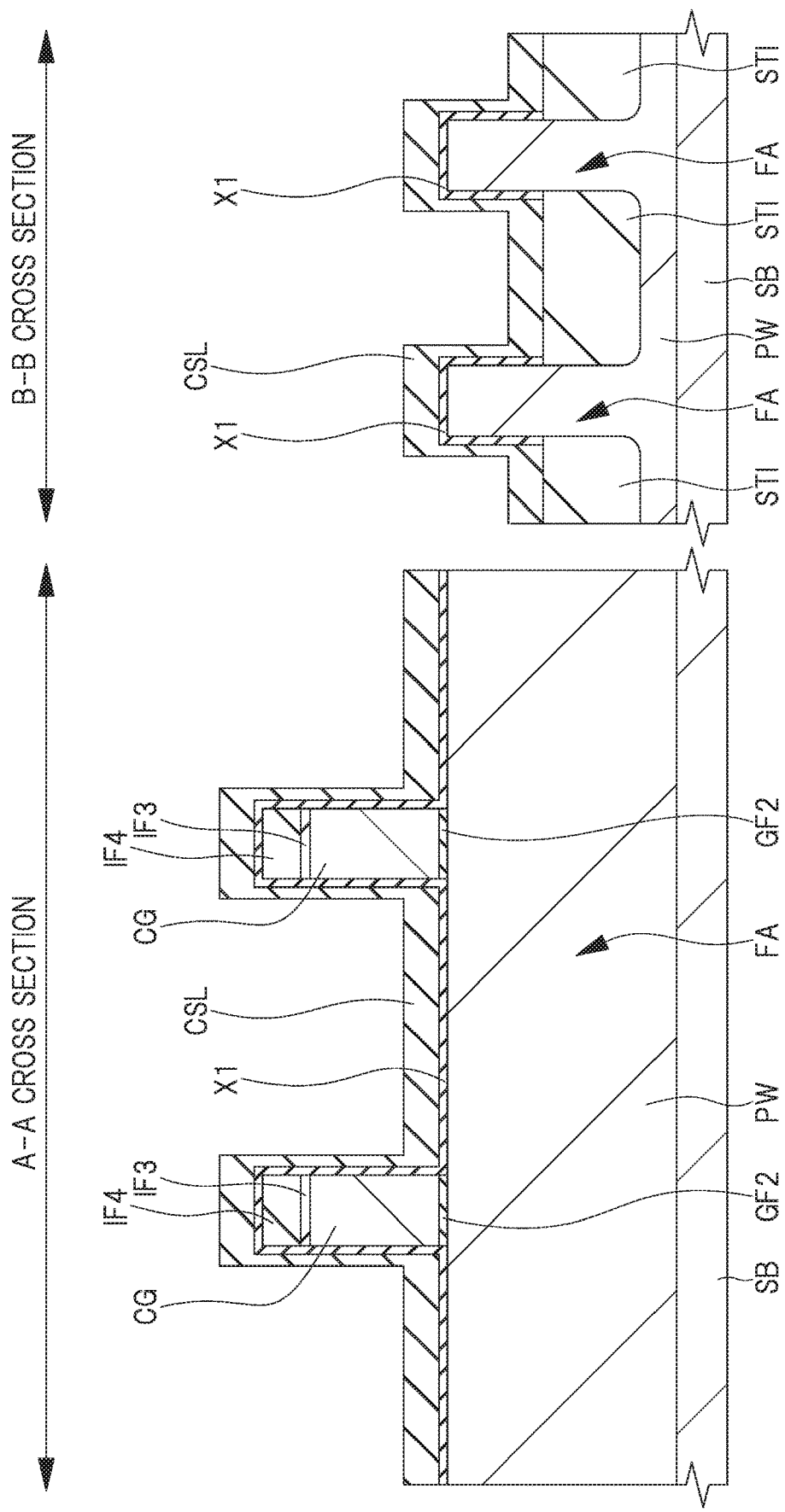
FIG. 24 is a cross-sectional view illustrating a manufacturing process of a semiconductor device according to the second embodiment.
Figure 25:
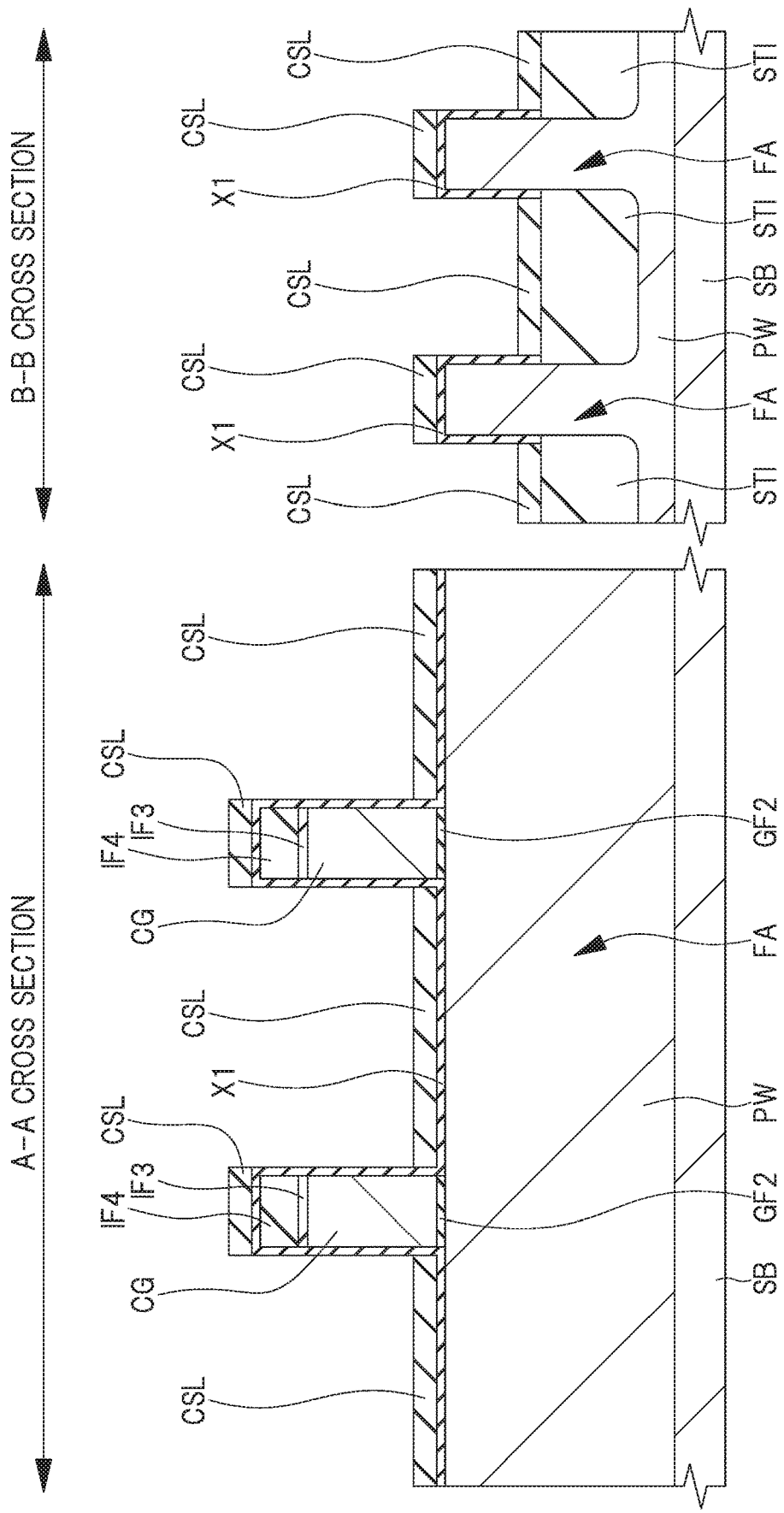
FIG. 25 is a cross-sectional view illustrating a manufacturing process of the semiconductor device following FIG. 24.

Hereinafter, a semiconductor device of a second embodiment will be described with reference to FIGS. 23 to 25. FIGS. 23 to 25 show a cross section A-A and a cross section B-B of FIG. 1, similarly to the first embodiment. In the following description, differences from the first embodiment will be mainly described.

In the first embodiment, the charge storage layer CSL is formed over the upper surface and the side surface of the fin FA and over the upper surface of the element isolation portion STI.

In the second embodiment, as shown in the B-B cross-section of FIG. 23, the charge storage layer CSL is formed over the upper surface of the fin FA and over the upper surface of the element isolation portion STI, but is not formed over the side surface of the fin FA. Further, as shown in the A-A cross section of FIG. 23, the charge storage layer CSL is not formed over the side surface of the control gate electrode CG.

The charge storage layer CSL according to the second embodiment is a metal oxide film such as a hafnium silicate (HfSiO) film, for example, and a trapping insulating film having a trap level capable of storing charge, similarly to the charge storage layer CSL according to the first embodiment. Here, when the number of times of rewriting of the memory cell MC increases, the charge stored in the charge storage layer CSL may easily move in the charge storage layer CSL.

For example, in the first embodiment, as shown in the B-B cross-section of FIG. 3 and the like, the charge storage layer CSL is formed so as to extend over the fins FA adjacent to each other. For this reason, when the interval between the fins FA is small, the stored charge may move in the charge storage layer CSL to vary the threshold value of the adjacent memory cell MC.

On the other hand, in the second embodiment, since the charge storage layer CSL is not formed over the side surface of the fin FA and the charge storage layers CSL formed over the upper surfaces of the fins FA adjacent to each other are separated from each other, even if the stored charge moves in the charge storage layer CSL, it is possible to suppress the possibility of changing the threshold value of the adjacent memory cell MC. Therefore, in the second embodiment, the reliability of the semiconductor device can be further improved as compared with the first embodiment.

The charge storage layers CSL formed over the fins FA adjacent to each other may be separated from each other, and at least a part of the charge storage layer CSL may be separated from each other over the side surface of the fin FA. In other words, a part of the charge storage layer CSL may exist over the side surface of the fin FA, and the charge storage layer CSL formed over the upper surface of the fin FA and the charge storage layer CSL formed over the element isolation portion STI may be separated from each other.

An example of a manufacturing method for forming the semiconductor device of the second embodiment will be described below.

First, the manufacturing process of the second embodiment is performed in the same manner as the manufacturing process up to FIG. 14 of the first embodiment. Next, as shown in FIG. 24, the insulating film X1 and the charge storage layer CSL are sequentially formed. The method, materials, and the like for forming the insulating film X1 and the charge storage layer CSL in the second embodiment are the same as those in the first embodiment. In the step of FIG. 24, the thickness of the charge storage layer CSL formed over the upper surface of the fin FA is larger than the thickness of the charge storage layer CSL formed over the side surface of the fin FA.

Next, isotropic etching is performed to thin the entire charge storage layer CSL. As a result, as shown in the B-B cross section of FIG. 25, the charge storage layer CSL formed over the side surface of the fin FA is removed, and the thickness of the charge storage layer CSL formed over the upper surface of the fin FA is reduced, but left without being completely removed. In addition, as shown in the A-A cross section of FIG. 25, the charge storage layer CSL formed over the side surface of the control gate electrode CG is also removed. Here, as described above, at least a part of the charge storage layer CSL may be separated over the side surface of the fin FA, and the charge storage layer CSL may be left over a part of the side surface of the fin FA.

As described above, the charge storage layer CSL of the second embodiment can be formed. Next, an insulating film X2 is formed in the same manner as in the first embodiment. The subsequent manufacturing process is the same as that of FIG. 16 and the subsequent steps of the first embodiment.

Third Embodiment

Figure 26:
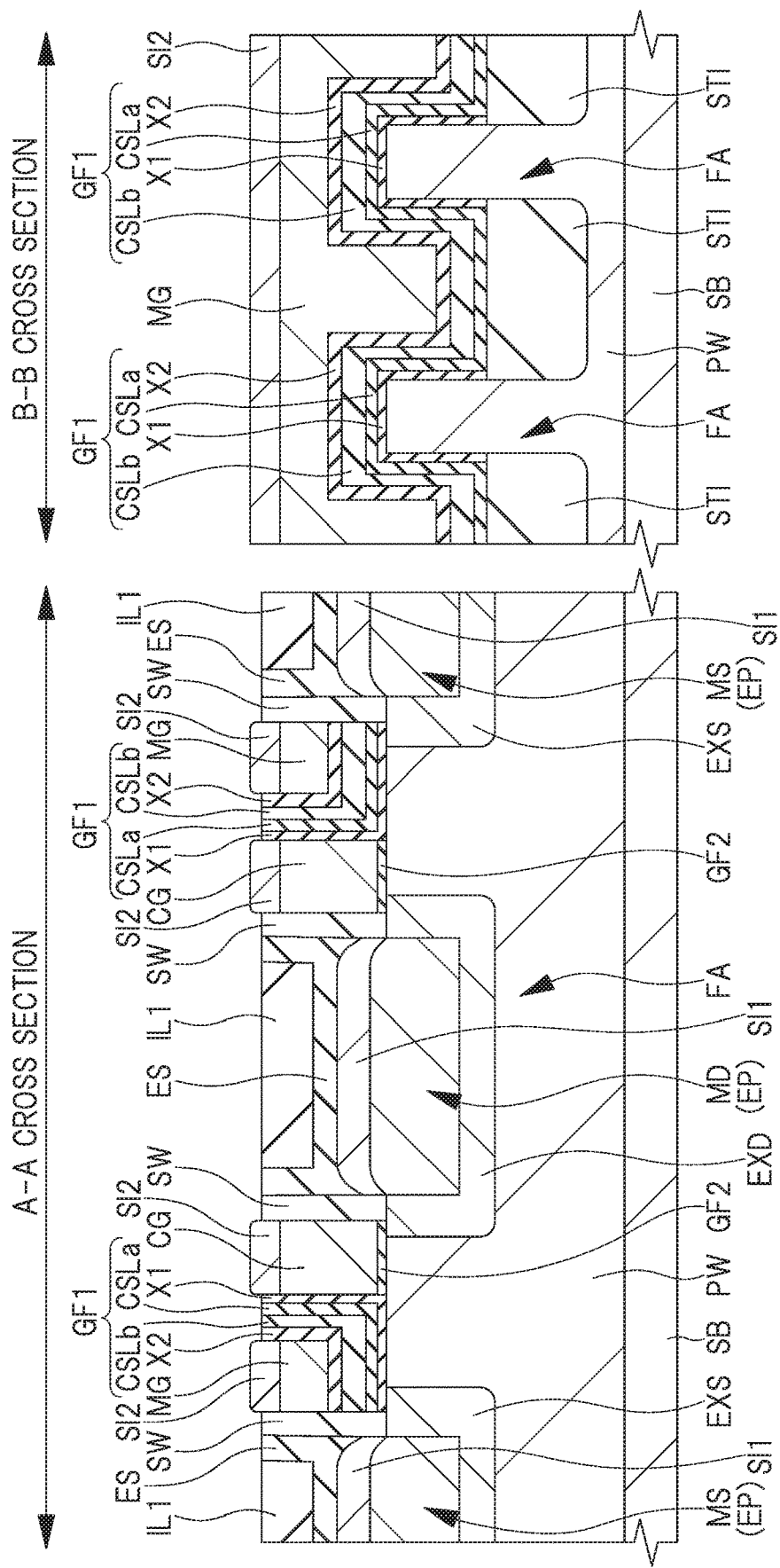
FIG. 26 is a cross-sectional view illustrating a semiconductor device of a third embodiment.
Figure 27:
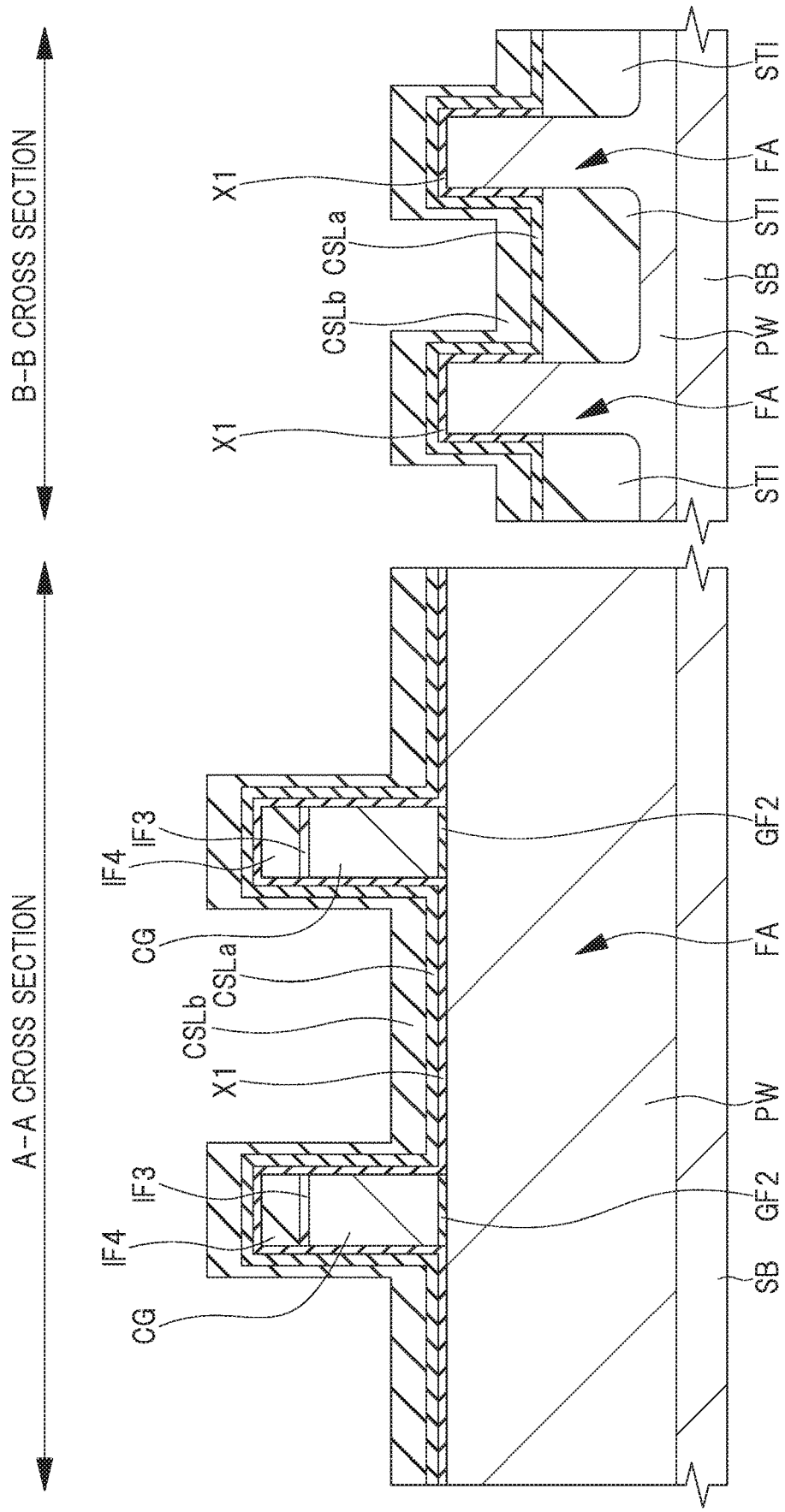
FIG. 27 is a cross-sectional view illustrating a manufacturing process of the semiconductor device of the third embodiment.

Hereinafter, a semiconductor device of a third embodiment will be described with reference to FIGS. 26 and 27. FIGS. 26 and 27 show the A-A cross section and the B-B cross section of FIG. 1 in the same manner as in the first embodiment. In the following description, differences from the first embodiment will be mainly described.

In the first embodiment, a single-layer metal oxide film such as a hafnium silicate film (HfSiO film) is used as the charge-storage layer CSL, which is a trapping insulating film.

In the third embodiment, as shown in FIG. 26, a stacked-layer structure of the charge storage layer CSLa and the charge storage layer CSLb is used as the trapping insulating film. The charge storage layer CSLa is, for example, silicon nitride film ($Si_3N_4$ films). The charge storage layer CSLb is made of a material different from the material of the charge storage layer CSLa, and is, for example, a metal oxide film such as a hafnium silicate film (HfSiO film). The trap level density of the charge storage layer CSLb is larger than the trap level density of the charge storage layer CSLa, but the trap level of the charge storage layer CSLb is shallower than the trap level of the charge storage layer CSLa.

As shown in the B-B cross-section of FIG. 26, the charge storage layer CSLa is formed over the upper surface and the side surfaces of the fins FA and over the upper surface of the element isolation portion STI, and the thickness of the charge storage layer CSLa is substantially uniform at the respective locations. The thickness of the charge storage layer CSLb formed over the upper surface of the fin FA is larger than the thickness of the charge storage layer CSLb formed over the side surface of the fin FA.

The total thickness of the charge storage layer CSLa and the charge storage layer CSLb formed over the upper surface of the fin FA ranges from 2 to 4 times the total thickness of the charge storage layer CSLa and the charge storage layer CSLb formed over the side surface of the fin FA. Therefore, the thickness of the gate insulating film GF2 is relatively thick on the upper surface of the fin FA and relatively thin on the side surface of the fin FA, similarly to the first embodiment. Therefore, also in the third embodiment, as in the first embodiment, the electric field applied to the insulating film X1 can be relaxed on the upper surface of the fin FA.

The thickness of the charge storage layer CSLb of the third embodiment may be thinner than the thickness of the charge storage layer CSL of the first embodiment.

As described above, in the third embodiment, since the charge storage layer CSLa and the charge storage layer CSLb having different depths of trap levels are provided, charges are stored in the respective films, so that the charge storing amounts of the memory cells MC can be increased. In addition, trap levels are also formed at the interface between the charge storage layer CSLa and the charge storage layer CSLb, so that the charge storing amounts of the memory cells MC can be increased. Therefore, the reliability of the memory cell MC can be improved.

An example of a manufacturing method for forming the semiconductor device of the third embodiment will be described below.

First, the manufacturing process of the third embodiment is performed in the same manner as the manufacturing process up to FIG. 14 of the first embodiment. Next, as shown in FIG. 27, the insulating film X1, the charge storage layer CSLa, and the charge storage layer CSLb are sequentially formed. The method of forming the insulating film X1 in the second embodiment is the same as that in the first embodiment.

The charge storage layer CSLa is a trapping insulating film having a trap level capable of storing charge, and is formed by a CVD method or an ALD method, and is, for example, a silicon nitride film ($Si_3N_4$ film).

The charge storage layer CSLa is formed over the side surface of the control gate electrode CG and the upper surface of the fin FA via the insulating film X1 in the A-A cross-section, and is formed over the upper surface and the side surface of the fin FA via the insulating film X1 in the B-B cross section. In the B-B cross section, the charge storage layer CSLa is also formed over the upper surface of the element isolation portion STI between the fins FA that are adjacent to each other. At these positions, the thickness of the charge storage layer CSLa is substantially the same.

Next, a charge storage layer CSLb is formed on the charge storage layer CSLa. The charge storage layer CSLb is a trapping insulating film having a trap level capable of storing charge, and is formed by using, for example, a sputtering method, and is, for example, a metal oxide film containing hafnium (Hf) and silicon (Si). In the third embodiment, a hafnium silicate film (HfSiO film) is representatively exemplified as the metal oxide film of the charge storage layer CSLb.

As shown in the B-B cross section, since the charge storage layer CSLb of the second embodiment is formed by using a sputtering method, the thickness of the charge storage layer CSLb formed over the upper surface of the fin FA is larger than the thickness of the charge storage layer CSLb formed over the side surface of the upper portion of the fin FA.

In the third embodiment, the charge storage layer CSLa is formed first by a CVD method or an ALD method, and then the charge storage layer CSLb is formed by a sputtering method. Therefore, since the insulating film X1 is not directly exposed to the sputtering, it is possible to prevent the dielectric breakdown voltage of the insulating film X1 from being reduced. Therefore, in the third embodiment, the reliability of the memory cell MC can be further improved as compared with the first embodiment.

Next, in the same manner as in the first embodiment, an insulating film X2 is formed on the charge storage layer CSLb. The subsequent manufacturing process is the same as that of FIG. 16 and the subsequent steps of the first embodiment.

Fourth Embodiment

Figure 28:
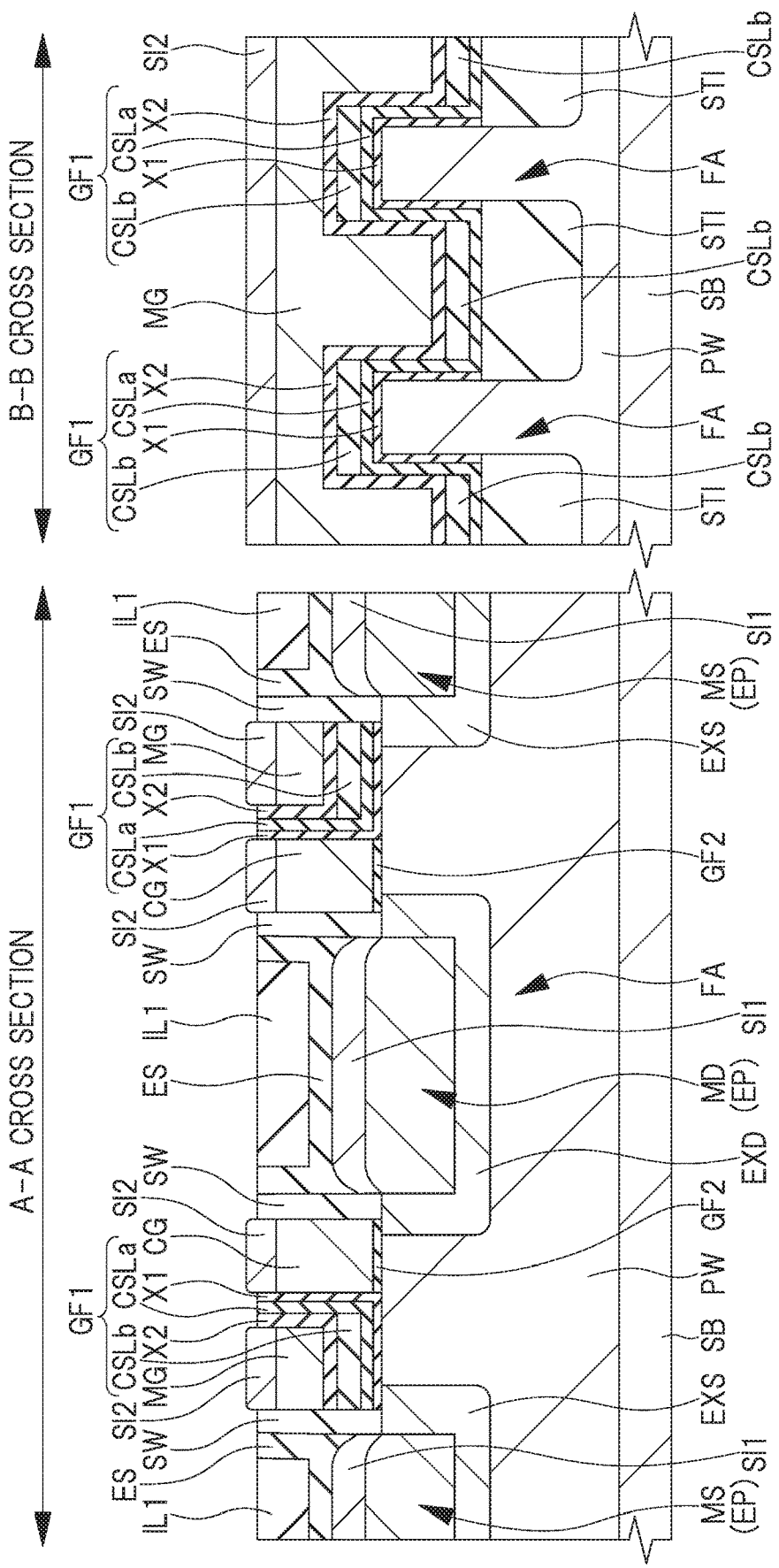
FIG. 28 is a cross-sectional view illustrating a semiconductor device of a fourth embodiment.
Figure 29:
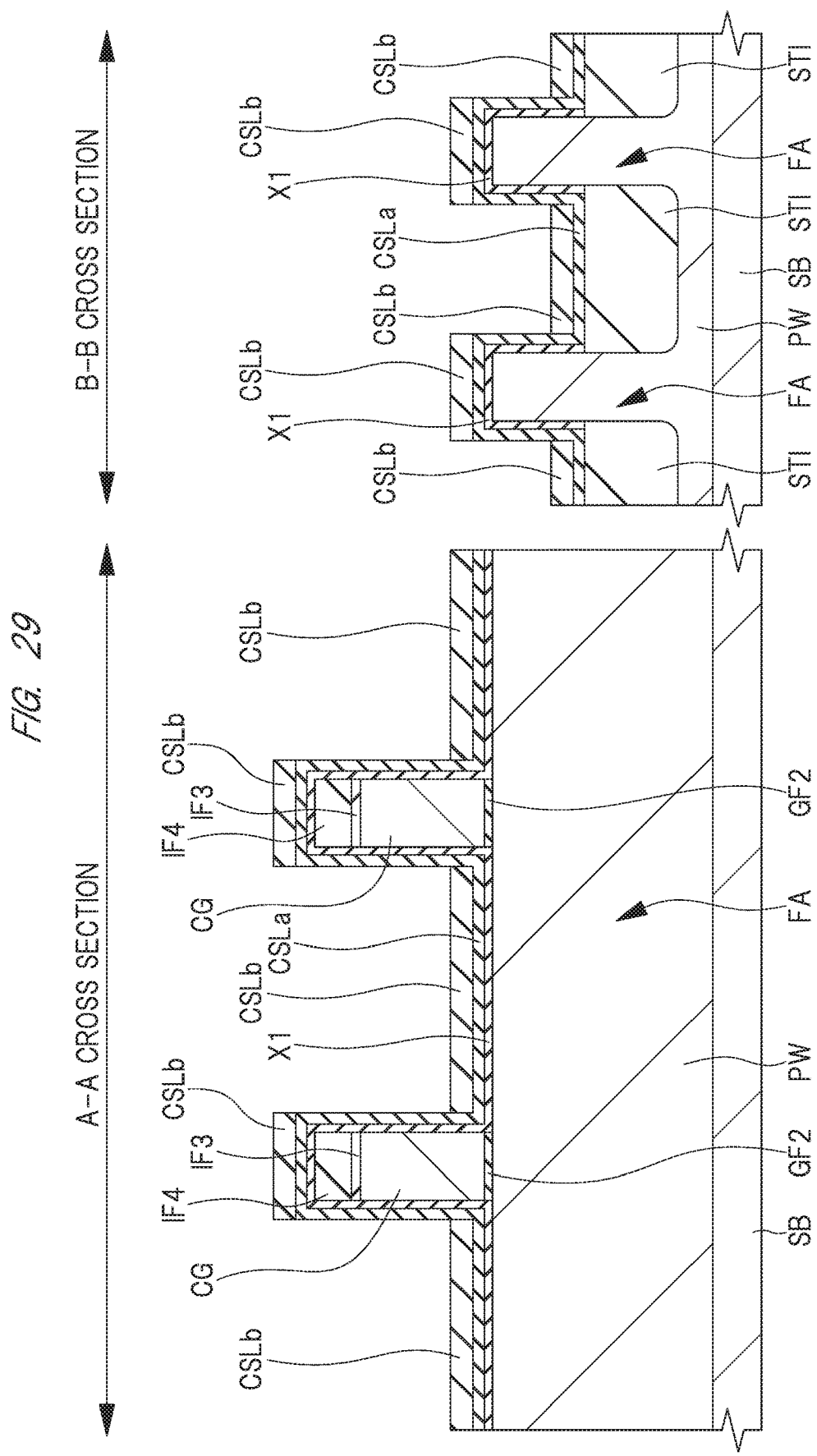
FIG. 29 is a cross-sectional view illustrating a manufacturing process of the semiconductor device of the fourth embodiment.

Hereinafter, a semiconductor device of a fourth embodiment will be described with reference to FIGS. 28 and 29. FIGS. 28 and 29 show a cross section A-A and a cross section B-B of FIG. 1, similarly to the first embodiment. In the following description, differences from the third embodiment will be mainly described.

As shown in FIG. 28, in the fourth embodiment as well, a trapping insulating film has a laminated structure of the charge storage layer CSLa and the charge storage layer CSLb made of materials differing from those of the charge storage layer CSLa, similarly to the third embodiment.

As shown in the B-B cross section of FIG. 28, the charge storage layer CSLb is formed over the upper surface of the fin FA and the upper surface of the element isolation portion STI, but is not formed over the side surface of the fin FA. Therefore, in the fourth embodiment, the charge storing amount of the memory cell MC is smaller than that in the third embodiment. Further, as shown in the A-A cross section of FIG. 28, the charge storage layer CSLb is not formed over the side surface of the control gate electrode CG either.

Here, as in the third embodiment, the charge storage layer CSLb is an insulating film having a shallower trap level as compared with the charge storage layer CSLa. In other words, the charge storage layer CSLb is an insulating film in which the stored charge is easier to move in the charge storage layer CSLb than the charge storage layer CSLa. In the fourth embodiment, the charge storage layers CSLb formed over the upper surfaces of the fins FA of the memory cells MC are separated from each other. Therefore, it is possible to suppress a problem in which the stored charges move in the charge storage layer CSLb and the threshold value of the neighboring memory cell MC is changed.

That is, in the fourth embodiment, compared with the third embodiment, although the charge storing amount of the memory cell MC is reduced, it is possible to more reliably suppress the problem of varying the threshold value of the memory cell MC.

The charge storage layers CSLb formed over the fins FA adjacent to each other may be separated from each other, and at least a part of the charge storage layers CSLb may be separated from each other over the side surfaces of the fins FA. In other words, a part of the charge storage layer CSLb may exist over the side surface of the fin FA, and the charge storage layer CSLb formed over the upper surface of the fin FA and the charge storage layer CSLb formed over the element isolation portion STI may be separated from each other.

An example of a manufacturing method for forming the semiconductor device of the fourth embodiment will be described below.

First, the manufacturing process of the fourth embodiment is performed in the same manner as the manufacturing process up to FIG. 27 of the third embodiment. Next, as shown in FIG. 29, an isotropic etching process is performed to reduce the thickness of the entire charge storage layer CSLb. As a result, as shown in the B-B cross section of FIG. 29, the charge storage layer CSLb formed over the side surface of the fin FA is removed, and the thickness of the charge storage layer CSLb formed over the upper surface of the fin FA is reduced, but left without being completely removed. In addition, as shown in the A-A cross section of FIG. 29, the charge storage layer CSLb formed over the side surface of the control gate electrode CG is also removed.

Here, as described above, at least a part of the charge storage layer CSLb may be separated over the side surface of the fin FA, and the charge storage layer CSLb may be left over a part of the side surface of the fin FA.

Next, in the same manner as in the first embodiment, an insulating film X2 is formed on the charge storage layer CSLa and the charge storage layer CSLb. The subsequent manufacturing process is the same as that of FIG. 16 and the subsequent steps of the first embodiment.

Fifth Embodiment

Figure 30:
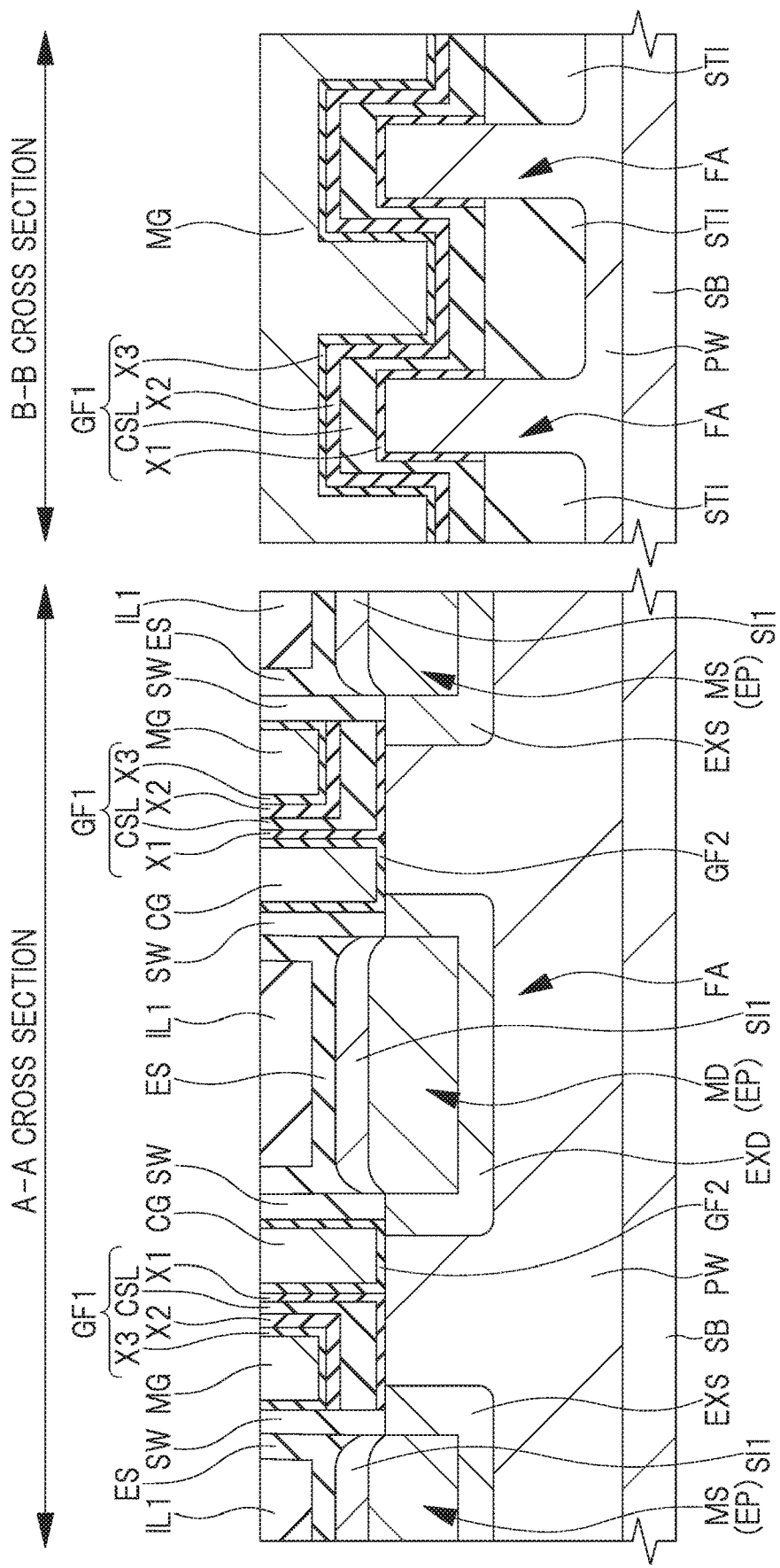
FIG. 30 is a cross-sectional view illustrating a semiconductor device of a fifth embodiment.
Figure 31:
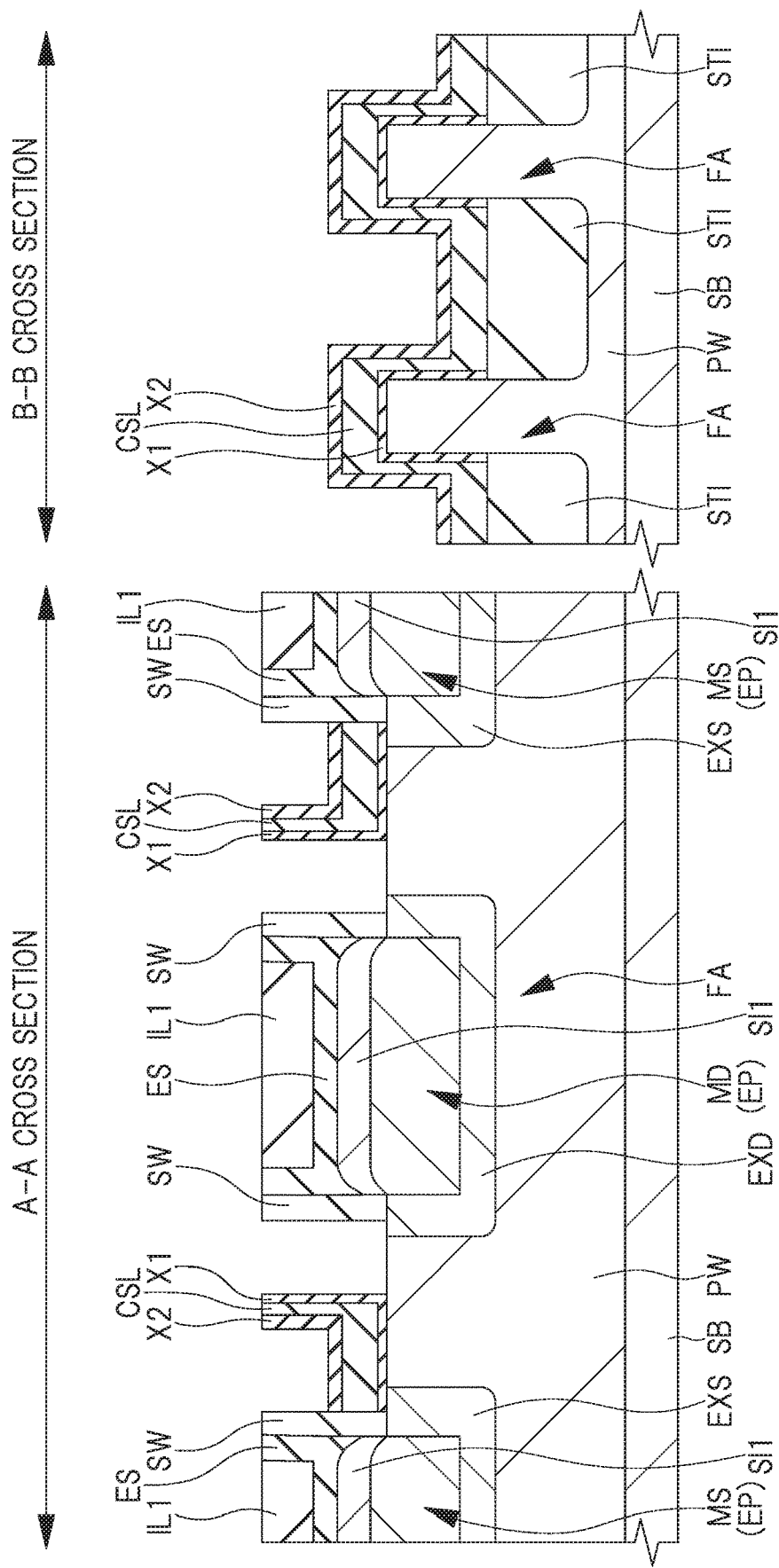
FIG. 31 is a cross-sectional view illustrating a manufacturing process of the semiconductor device of the fifth embodiment.

Hereinafter, a semiconductor device of a fifth embodiment will be described with reference to FIGS. 30 and 31. FIGS. 30 and 31 show a cross section A-A and a cross section B-B of FIG. 1, similarly to the first embodiment. In the following description, differences from the first embodiment will be mainly described.

In the first embodiment, a polycrystalline silicon film is applied to the materials of the control gate electrode CG and the memory gate electrode MG, and the silicide layer SI2 is formed on the polycrystalline silicon film.

In the fifth embodiment, as shown in the A-A cross section of FIG. 30, a metal film is applied to the materials of the control gate electrode CG and the memory gate electrode MG. Such a metal film is made of, for example, a tantalum nitride film, a titanium aluminum film, a titanium nitride film, a tungsten film, or a single-layer metal film made of an aluminum film, or a stacked film in which these films are appropriately stacked.

In the first embodiment, the gate insulating film GF2 such as a silicon oxide film is formed under the control gate electrode CG, but a metal oxide film such as a hafnium oxide film may be applied to the gate insulating film GF2. In the fifth embodiment, the gate insulating film GF2 is formed so as to cover the side surface and the bottom surface of the control gate electrode CG.

Further, as shown in the B-B cross section of FIG. 30, the insulating film X3 is formed on the insulating film X2, and the memory gate electrode MG is formed on the insulating film X3. The insulating film X3 is formed so as to cover the side surface and the bottom surface of the memory gate electrode MG, as shown in the A-A cross section of FIG. 30.

Like the insulating film X2, the insulating film X3 has a function of improving the dielectric breakdown voltage between the charge storage layer CSL and the memory gate electrode MG. In this manner, the insulating film X3 is formed as a part of the gate insulating film GF1.

The materials of the control gate electrode CG, the gate insulating film GF2, the memory gate electrode MG, and the insulating film X3 can be selected from the above materials on the basis of the threshold voltage required for each transistor or the like.

When the dielectric breakdown voltage between the charge storage layer CSL and the memory gate electrode MG is sufficiently maintained only by the insulating film X3, the insulating film X2 may not be formed.

An example of a manufacturing method for forming the semiconductor device of the fifth embodiment will be described below.

First, the manufacturing method of the fifth embodiment is substantially the same as that of the first embodiment until immediately before the step of forming the silicide layer SI2 in the steps from FIG. 21 to FIG. 3. That is, a process of exposing the upper surfaces of the control gate electrode CG and the memory gate electrode MG is performed by using a CMP method.

Next, as shown in FIG. 31, the polycrystalline silicon film forming the control gate electrode CG and the memory gate electrode MG is removed. The silicon oxide film formed under the control gate electrode CG is also removed. Next, a metal oxide film such as a hafnium oxide film is formed in the region from which the polycrystalline silicon film has been removed, by a CVD method or an ALD method. Next, a single-layer metal film including a tantalum nitride film, a titanium aluminum film, a titanium nitride film, a tungsten film, or an aluminum film, or a stacked-layer film in which these films are stacked as appropriate is formed on the metal oxide film by a CVD method or a sputtering method. Next, the metal oxide film and the metal film over the interlayer insulating film IL1 are removed by a CMP method.

Thereby, the gate insulating film GF2 and the insulating film X3 made of the metal oxide film are formed, and the control gate electrode CG and the memory gate electrode MG made of the metal film are formed.

In the fifth embodiment, the gate insulating film GF2 and the insulating film X3 are formed in the same step, and the control gate electrode CG and the memory gate electrode MG are formed in the same step, however, they may be formed in different steps. For example, the gate insulating film GF2 and the control gate electrode CG may be formed first, and then the insulating film X3 and the memory gate electrode MG may be formed. The metal oxide film and the metal film may be applied only to the gate insulating film GF2 and the control gate electrode CG.

The technique disclosed in the fifth embodiment can also be applied to the second embodiment to the fourth embodiment described above.

Although the invention made by the present inventor has been specifically described based on the embodiments, the present invention is not limited to the embodiments described above, and various modifications can be made without departing from the gist thereof.

What is claimed is:

1. A semiconductor device comprising:
    an element isolation portion formed on a main surface of a semiconductor substrate;
    a protruding portion formed on the main surface of the semiconductor substrate defined by the element isolation portion, and formed of a semiconductor layer protruded from the main surface of the semiconductor substrate than the element isolation portion;
    a first gate insulating film including a first insulating film formed so as to cover the protruding portion, and a first trapping insulating film formed so as to cover the first insulating film; and
    a first gate electrode formed so as to cover the first gate insulating film, wherein:
    the protruding portion has a first side surface, a second side surface opposed to the first side surface, and an upper surface positioned between the first side surface and the second side surface in plan view,
    a thickness of the first trapping insulating film over the upper surface of the protruding portion is larger than a thickness of the first trapping insulating film on the first side surface and the second side surface of the protruding portion, and
    wherein a ratio of the thickness of the first trapping insulating film over the upper surface of the protruding portion to the thickness of the first trapping insulating film on the first side surface and the second side surface is set such that an electric field applied to the upper surface of the protruding portion and an electric field applied to on the first side surface and the second side surface are equalized.

2. The semiconductor device according to claim 1, wherein:
    each of the protruding portion, the first gate insulating film and the first gate electrode comprises a part of a fin-type transistor including the protruding portion, as a channel region, that is covered with the first gate insulating film and the first gate electrode.

3. The semiconductor device according to claim 1, wherein:
    the protruding portion has a top portion which is positioned at the highest position of the protruding portion, and a side portion which is positioned between the top portion of the protruding portion and the upper surface of the element isolation portion, and
    a thickness of the first trapping insulating film on the top portion is larger than a thickness of the first trapping insulating film on the side portion.

4. The semiconductor device according to claim 1, wherein:
    a thickness of the first trapping insulating film on the upper surface of the protruding portion is in a range 2 to 4 times of the thickness of the first trapping insulating film on the first side surface or the second side surface of the protruding portion.

5. The semiconductor device according to claim 1, further comprising:
    a second trapping insulating film formed on the upper surface, the first side surface and the second side surface of the protruding portion via the first insulating film and made of a material different from the first trapping insulating film,
    wherein the first trapping insulating film is formed on at least the upper surface of the protruding portion via the first insulating film and the second trapping insulating film.

6. The semiconductor device according to claim 5, wherein:
    the first trapping insulating film and the second trapping insulating film are capable of storing electric charges, and
    a trap level of the first trapping insulating film is shallower than a trap level of the second trapping insulating film.

7. The semiconductor device according to claim 1, further comprising:
a second gate insulating film formed on the upper surface, the first side surface, and the second side surface of the protruding portion; and
a second gate electrode formed on the second gate insulating film, wherein:
the second gate electrode is formed adjacent to the first gate electrode and so as to extend along the first gate electrode in a short side direction of the protruding portion in plan view, and
the first gate insulating film, the first gate electrode, the second gate insulating film, and the second gate electrode each constitute a part of a nonvolatile memory cell.

8. The semiconductor device according to claim 7, wherein:
when writing operation of the nonvolatile memory cell, electrons are injected into the first trapping insulating film and
when erasing operation of the nonvolatile memory cell, holes are injected into the first trapping insulating film.

9. The semiconductor device according to claim 1, wherein:
the first trapping insulating film is formed of a metal oxide film containing hafnium and silicon.

10. A semiconductor device comprising:
an element isolation portion formed on a main surface of a semiconductor substrate,
a nonvolatile memory cell formed on a protruding portion protruded from the main surface of the semiconductor substrate than the element isolation portion and formed on the semiconductor substrate, wherein:
the nonvolatile memory cell has a charge storage layer, and
a thickness of the charge storage layer on an upper surface of the protruding portion is larger than a thickness of the charge storage layer on a side surface of the protruding portion,
wherein a ratio of the thickness of the charge storage layer over the upper surface of the protruding portion to the thickness of the charge storage layer on the side surface is set such that an electric field applied to the upper surface of the protruding portion and an electric field applied to on the side surface are equalized.

11. The semiconductor device according to claim 10, wherein:
the thickness of the charge storage layer on the upper surface of the protruding portion is in the range 2 to 4 times of the thickness of the charge storage layer on the side surface of the protruding portion.

12. The semiconductor device according to claim 11, wherein:
the charge storage layer includes a metal oxide film.

* * * * *